United States Patent
Nandakumar

(10) Patent No.: US 8,962,406 B2
(45) Date of Patent: Feb. 24, 2015

(54) FLATBAND SHIFT FOR IMPROVED TRANSISTOR PERFORMANCE

(71) Applicant: Texas Instruments Incorporated, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/497,524

(22) Filed: Sep. 26, 2014

(65) Prior Publication Data
US 2015/0011067 A1 Jan. 8, 2015

Related U.S. Application Data

(62) Division of application No. 13/746,150, filed on Jan. 21, 2013, now Pat. No. 8,878,310.

(60) Provisional application No. 61/589,075, filed on Jan. 20, 2012.

(51) Int. Cl.
*H01L 21/00* (2006.01)
*H01L 21/84* (2006.01)
*H01L 29/78* (2006.01)
*H01L 29/66* (2006.01)
*H01L 27/088* (2006.01)

(52) U.S. Cl.
CPC ........ *H01L 29/7836* (2013.01); *H01L 29/7835* (2013.01); *H01L 29/66681* (2013.01); *H01L 27/088* (2013.01)
USPC .... 438/163; 257/408; 257/549; 257/E29.266; 257/E21.435

(58) Field of Classification Search
None
See application file for complete search history.

(56) References Cited

U.S. PATENT DOCUMENTS

| | | |
|---|---|---|
| 2010/0032755 A1 | 2/2010 | Benaissa et al. |
| 2011/0147854 A1 | 6/2011 | Nandakumar et al. |
| 2011/0156144 A1 | 6/2011 | Benaissa et al. |

*Primary Examiner* — Sonya D McCall Shepard
(74) *Attorney, Agent, or Firm* — Jacqueline J. Garner; Frederick J. Telecky, Jr.

(57) ABSTRACT

An integrated circuit includes MOS and DEMOS transistors with at least one of indium, carbon, nitrogen, and a halogen dopant raising the threshold voltage of a portion of the DEMOS transistor gate overlying the DEMOS transistor channel. An integrated circuit includes MOS and LDMOS transistors with at least one of indium, carbon, nitrogen, and a halogen dopant raising the threshold voltage of a portion of the LDMOS transistor gate overlying the DEMOS transistor channel. A method of forming an integrated circuit with MOS and DEMOS transistors with at least one of indium, carbon, nitrogen, and a halogen dopant raising the threshold voltage of a portion of the DEMOS transistor gate overlying the DEMOS transistor channel. A method of forming an integrated circuit with MOS and LDMOS transistors with at least one of indium, carbon, nitrogen, and a halogen dopant raising the threshold voltage of a portion of the LDMOS transistor gate overlying the DEMOS transistor channel.

8 Claims, 25 Drawing Sheets

FLATBAND SHIFT FOR IMPROVED TRANSISTOR PERFORMANCE

CROSS REFERENCE TO RELATED APPLICATIONS

This application is a divisional of U.S. Nonprovisional patent application Ser. No. 13/746,150, filed Jan. 21, 2013, and claims the priority of U.S. Provisional Application No. 61/589,075, filed Jan. 20, 2012, the contents of which are herein incorporated by reference in its entirety.

FIELD OF THE INVENTION

This invention relates to the field of integrated circuits. More particularly, this invention relates to improving DEMOS and LDMOS transistor performance in integrated circuits.

BACKGROUND

As the dimensions of geometries in integrated circuits have scaled the transistor gate length has scaled smaller bringing the transistor source and drain closer together increasing short channel effects. As the source and drain diffusions get closer together, off current leakage increases due to drain induced barrier lowering allowing carriers to flow from drain to source. To reduce short channel effects halo implants with the same doping type as the substrate are added with an angled implant using the source and drain extension photo pattern. The angled implant adds doping under the edges of the gate adjacent to the source and drain extensions. This additional doping raises the threshold voltage of the transistor and increases the barrier height. When the transistor gate length gets very short the source and drain halo implants may overlap raising the channel doping and the barrier height, leading to lower transistor off current leakage.

To combat short channel effects in typical deep submicron transistors, the halo doping is increased to the extent that the carrier mobility and transistor drive (on-state) current are degraded due to increased carrier scattering from the high concentration of halo dopant atoms in the transistor channel.

Drain Extended MOS transistors (DEMOS) and Lateral Drain MOS transistors (LDMOS) are frequently used in parts of an integrated circuit to switch higher voltages. (high voltage input/output buffers and analog sub-circuits for example). The key feature that enables higher voltage operation in the DEMOS and LDMOS transistors is the presence of a lightly doped extended drain that either partially or fully depletes when a high voltage is applied to the drain. The voltage drop across the lightly doped extended drain lowers the surface electric field and voltage across the gate dielectric in the off state. This in turn allows the DEMOS and LDMOS transistor to switch at higher voltages and use a thin lower voltage gate dielectric for acceptable on-state performance.

The lightly doped drain extension may be formed by adding photo patterning and implantation steps to the process flow. To reduce cost the lightly doped drain extension may also be created using photo resist patterns and implantation steps already present in the process flow. (e.g. well and threshold voltage adjust implants). The DEMOS and LDMOS transistors may also share the same gate dielectric and source-side extension and halo implants as the core MOS transistors. This enables the DEMOS and LDMOS transistors with acceptable performance to be added to an integrated circuit processing flow without adding manufacturing cost.

SUMMARY

An integrated circuit with MOS and DEMOS transistors with at least one of indium, carbon, nitrogen, and a halogen dopant raising the threshold voltage of a portion of the DEMOS transistor gate overlying the DEMOS transistor channel. An integrated circuit with MOS and LDMOS transistors with at least one of indium, carbon, nitrogen, and a halogen dopant raising the threshold voltage of a portion of the LDMOS transistor gate overlying the LDMOS transistor channel. A method of forming an integrated circuit with MOS and DEMOS transistors with at least one of indium, carbon, nitrogen, and a halogen dopant raising the threshold voltage of a portion of the DEMOS transistor gate overlying the DEMOS transistor channel. A method of forming an integrated circuit with MOS and LDMOS transistors with at least one of indium, carbon, nitrogen, and a halogen dopant raising the threshold voltage of a portion of the LDMOS transistor gate overlying the DEMOS transistor channel.

DETAILED DESCRIPTION OF EXAMPLE EMBODIMENTS

In deep submicron transistors the halo doping may be sufficiently high to cause increased coulomb scattering of carriers (electrons/holes) in the transistor channel. This scattering mechanism reduces the carrier mobility leading to lower transistor drive current and degraded transistor performance.

Extended drain transistors such as DEMOS and LDMOS transistors may be added to an integrated circuit to enable the switching of a high voltage. To avoid increased processing costs, these transistors share the same gate dielectric, source side extension and halo implants with the core MOS transistors. When high level of halo/channel doping is used on the source side of DEMOS and LDMOS transistors, the performance of the DEMOS and LDMOS transistors is degraded To lower manufacturing costs and improve performance, drain extended MOS (DEMOS) and lateral drain MOS (LDMOS) transistors share the same low voltage gate dielectric with core MOS transistors. To enable high voltage operation, these transistors are also equipped with a lightly doped extended drain region between the drain transistor contact and the low voltage gate dielectric. This lightly doped extended drain partially or fully depletes when a high voltage is applied to the drain contact. The depletion region of the extended drain diffusion drops sufficient voltage between the drain contact and the low voltage gate dielectric so that the gate dielectric is not damaged. The extended drain allows the DEMOS and LDMOS transistors to switch at high voltages without low voltage gate dielectric reliability concerns.

In embodiments described herein, the threshold voltage (Vt) of the DEMOS and/or LDMOS transistor is raised by adding dopant species to lower the workfunction of the polysilicon transistor gate and/or to introduce interface charge in the transistor gate dielectric. This technique raises the threshold voltage of the transistor enabling the source side halo and/or channel doping of the DEMOS or LDMOS transistor to be reduced while maintaining an equivalent Vt. The lower halo and/or channel doping in turn reduces coulomb scattering leading to improved carrier (electron/hole) mobility and leading to improved DEMOS and LDMOS transistor performance.

In first example embodiments the Vtp of DEPMOS, LDPMOS, and PMOS transistors is raised enabling the p-type halo/channel dopant concentration to be reduced. The performance of the DEPMOS, LDPMOS and PMOS transistors is improved due to a reduction of carrier scattering in the channel.

In second example embodiments the Vtn of DENMOS, LDNMOS, and NMOS transistors is raised enabling the n-type halo/channel dopant concentration to be reduced. The performance of the DENMOS, LDNMOS, and NMOS transistors is improved due to a reduction of carrier scattering in the channel.

Steps in an example embodiment process flow which builds PMOS transistors and DEPMOS transistors with improved performance is illustrated in FIGS 1A through 1H, FIGS. 4A and 4B, and FIG. 5.

Figure 1A:
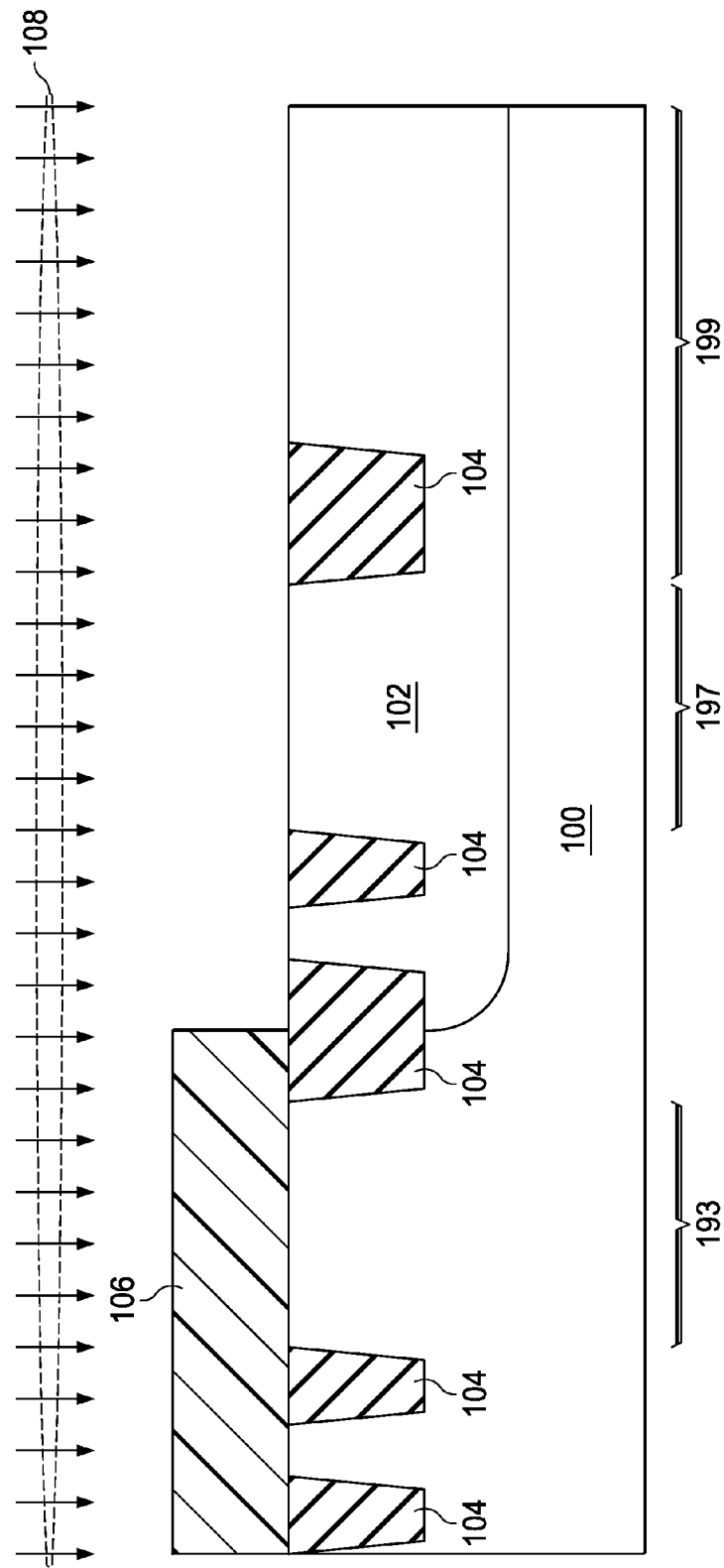
FIGS. 1A-1H are illustrations of steps in the fabrication of integrated circuits with DEPMOS transistors formed according to principles of the invention.

FIG. 1A shows a partially processed integrated circuit wafer. Shallow trench isolation (STI) dielectric 104 electrically isolates transistors and other devices from each other. An NWELL photoresist pattern 106 is formed on the wafer and n-type dopant 108 is implanted to form nwell 102.

Figure 1B:
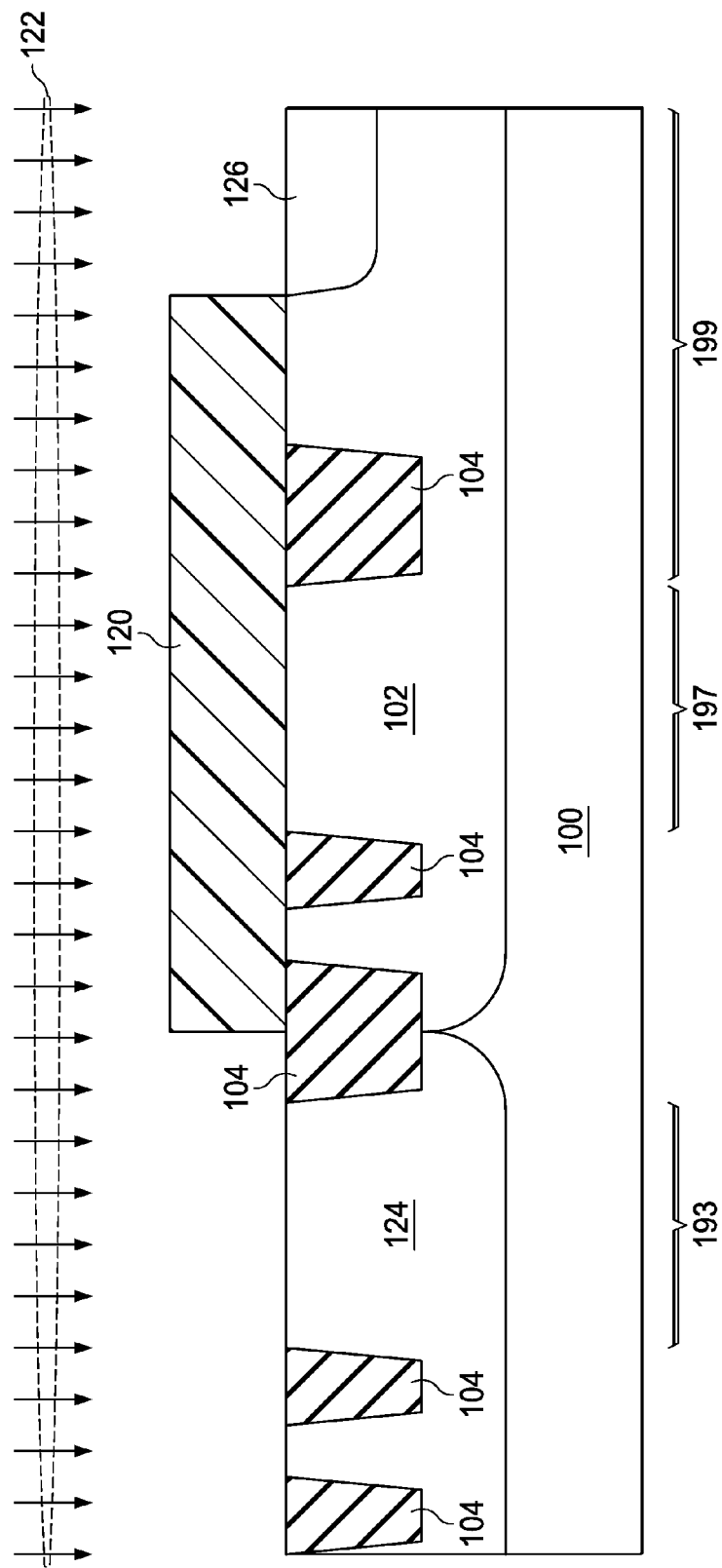

In FIG. 1B a pwell photoresist pattern 120 is formed on the integrated circuit wafer and p-type dopant 122 is implanted to form pwell 124 and to counter dope nwell 102 to form isolated pwell 126. The isolated pwell 126 will form the extended drain of an embodiment DEPMOS transistor.

Figure 1C:
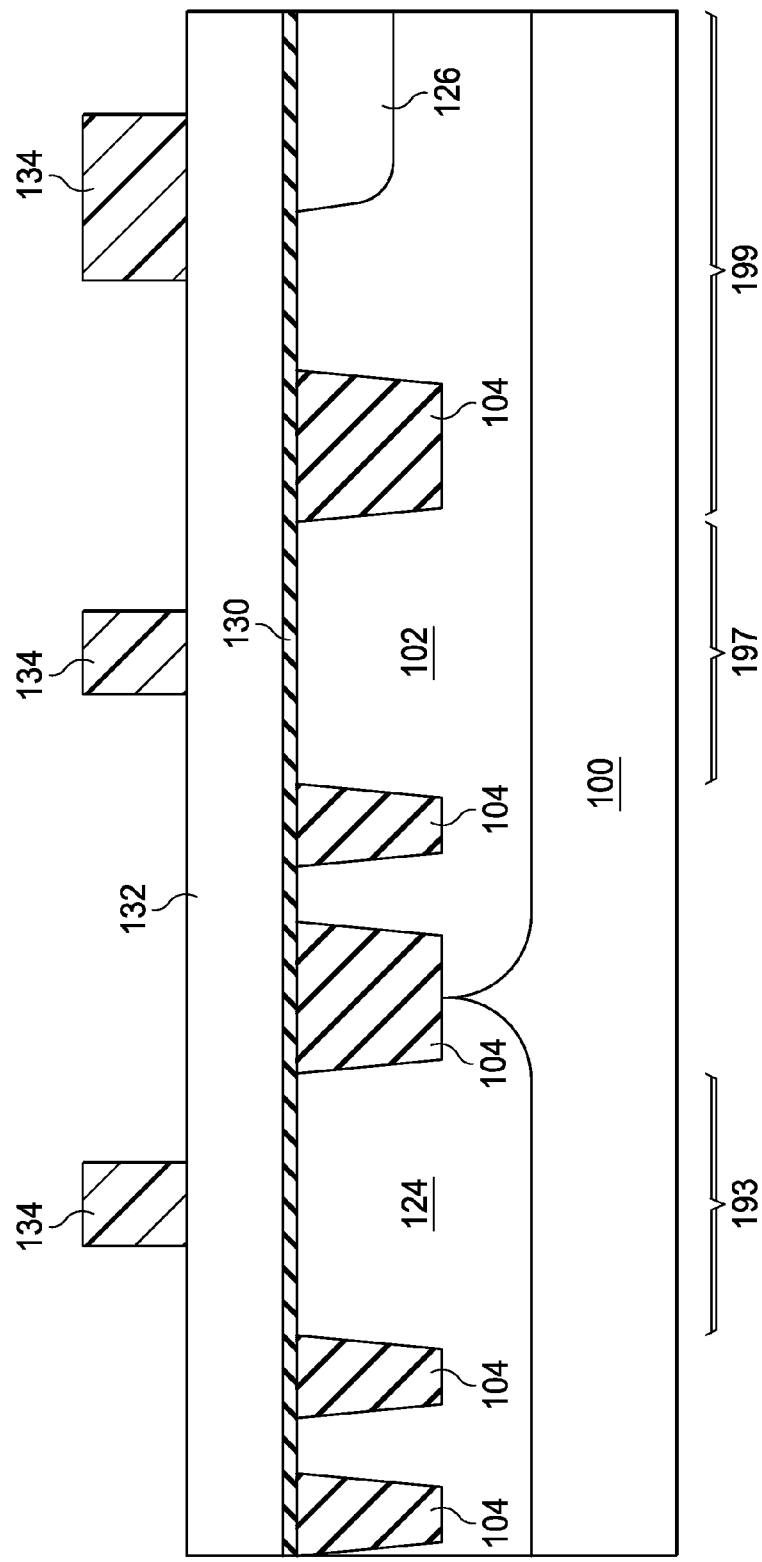

Gate dielectric 130 is then formed and polysilicon gate material 132 is deposited on the integrated circuit wafer as shown in FIG. 1C. The gate dielectric may be thermally grown silicon dioxide, nitrided silicon dioxide, silicon oxynitride, or a high-k dielectric. A transistor gate photo resist pattern 134 is formed on the polysilicon gate layer 132.

Figure 1D:
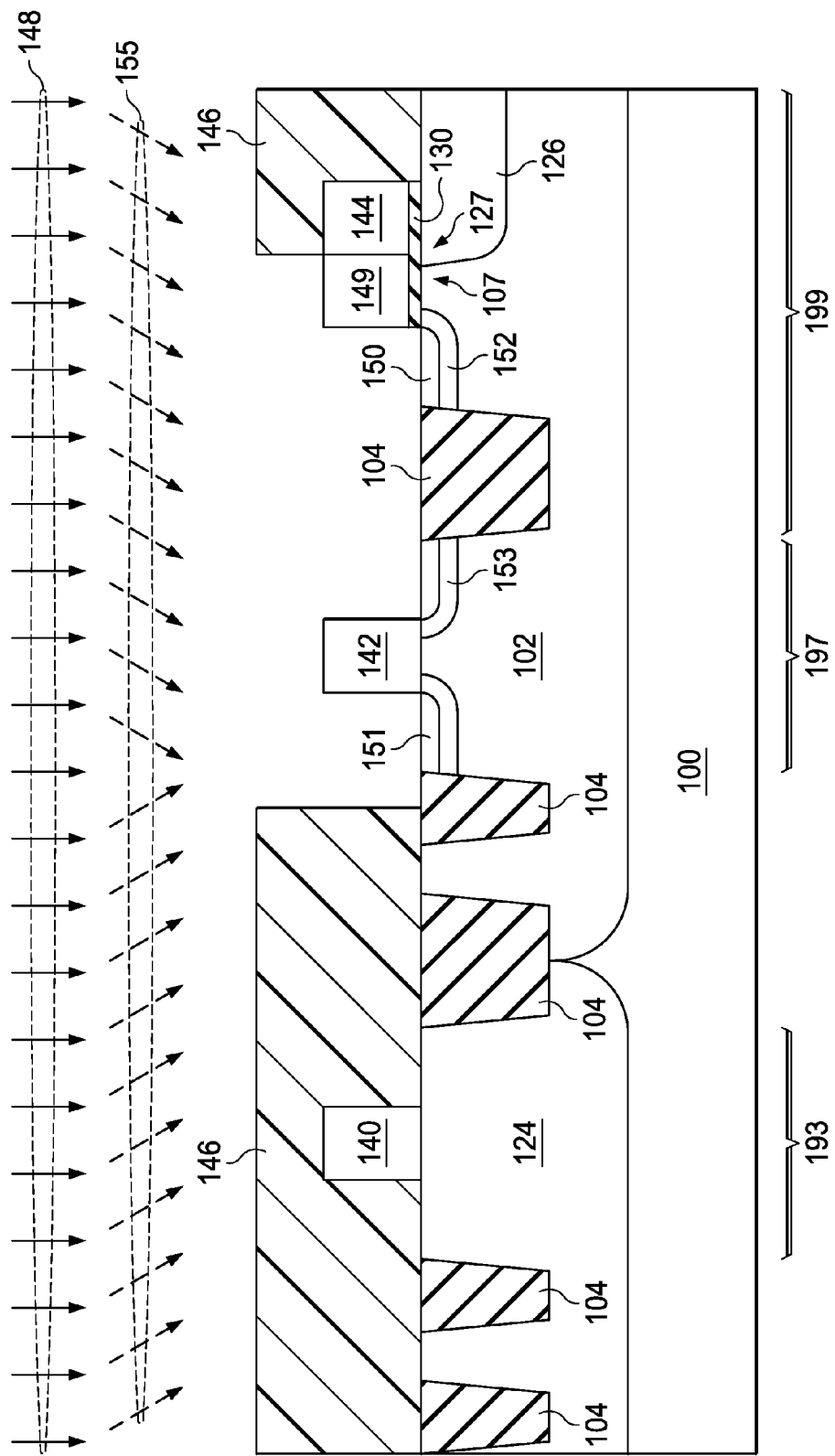
Figure 4A:
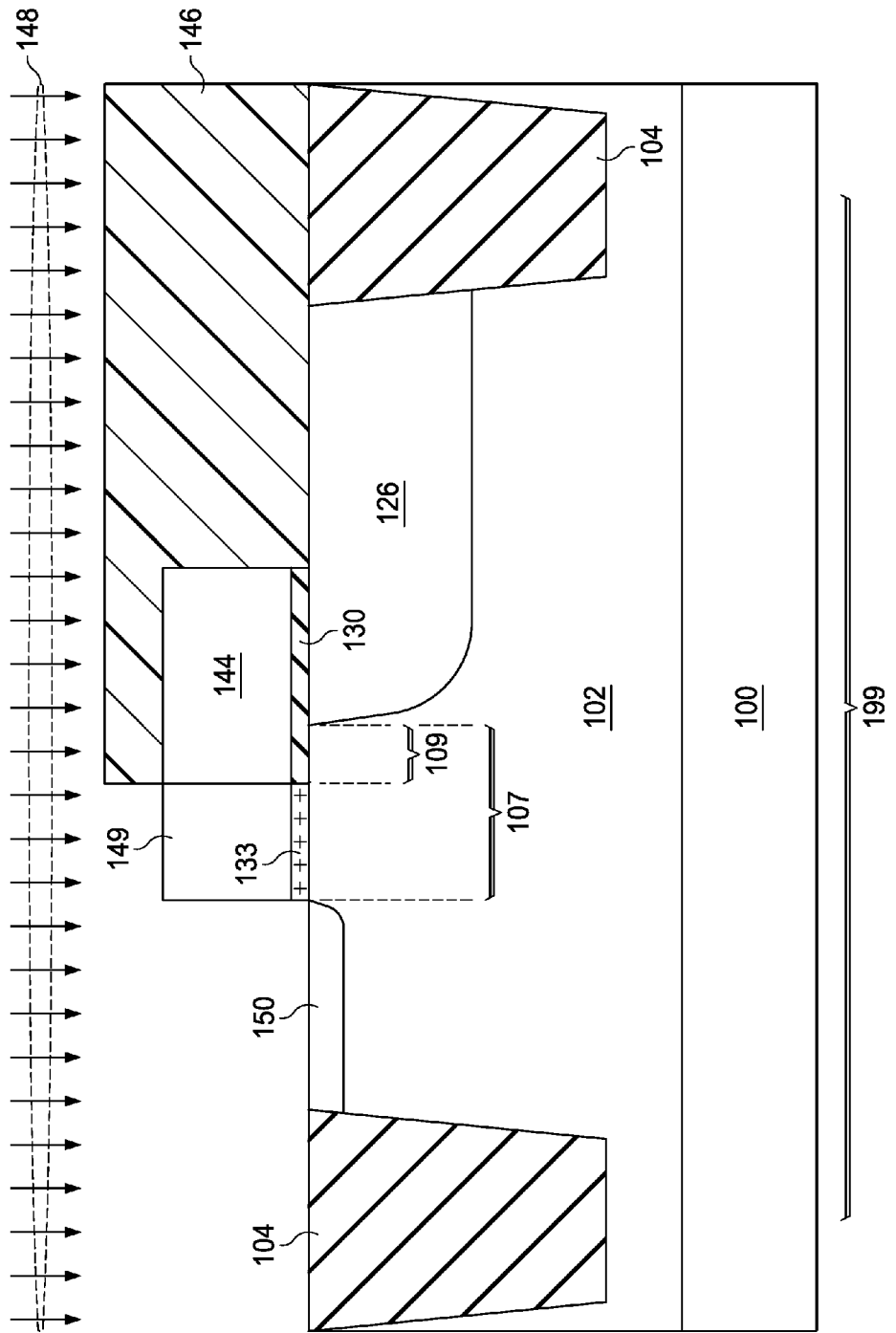
FIGS. 4A-4B are illustrations of steps in the fabrication of integrated circuits with DEPMOS transistors formed according to principles of the invention.

Referring now to FIG. 1D, a PMOS source and drain extension photo resist pattern 146 is formed on the integrated circuit wafer. This pattern opens the entire PMOS transistor 197, the source side 150 of the DEPMOS transistor 199, and a portion 149 of the polysilicon gate 144 of the DEPMOS transistor 199 adjacent to the source side 150. (See also FIG. 4) The exposed portion 149 of the polysilicon gate 144 may cover the entire channel region (107 plus 109) and a portion 127 of the drain extension 126 as shown in FIG. 1D. Alternatively, as depicted in FIG. 4A, the exposed portion 149 of the polysilicon gate 144 may cover only part 107 of the channel region and not cover the remaining part 109 of the channel and not cover any of the drain extension 126.

In a first type of example embodiment dopant is implanted into a portion of the gate 144 of DEPMOS transistor 199 to lower the workfunction. Indium dopant 148 is implanted into the exposed portion 149 of the DEPMOS transistor 199 polysilicon gate 144. In an example embodiment, an indium dose of $5\times10^{13}/cm^2$ to $4\times10^{14}/cm^2$, implanted into a 100 nm thick polysilicon gate with energy of about 10 to 40 keV, lowers the workfunction of the exposed portion 149 of the DEPMOS transistor 199 gate by about 50 to 300 mV. The indium dopant is also implanted into the gate 142 of the PMOS transistor 197 to lower its workfunction. As described earlier, lowering the workfunction raises the threshold voltage (Vtp) of the DEPMOS 199 and PMOS 197 transistors. This in turn allows the halo implant dose 155 to be lowered while still maintaining the specified Vtp, thereby improving the performance of the DEPMOS 199 and PMOS 197 transistors.

In another embodiment, indium plus carbon may be implanted to raise Vtp. In an example embodiment in addition to the indium implant a carbon dose of $1\times10^{14}/cm^2$ to $1\times10^{15}/cm^2$ may be implanted at energy of 2-10 keV into the 100 nm thick polysilicon gate.

In yet another embodiment, indium plus carbon plus a halogen such as fluorine, chlorine, bromine, iodine, or astatine may be implanted to raise Vtp. In an example embodiment, in addition to the indium and carbon, a fluorine dose of $1\times10^{14}/cm^2$ to $2\times10^{15}/cm^2$ may be implanted with energy of 1-10 keV into the 100 nm thick polysilicon gate.

Figure 5:
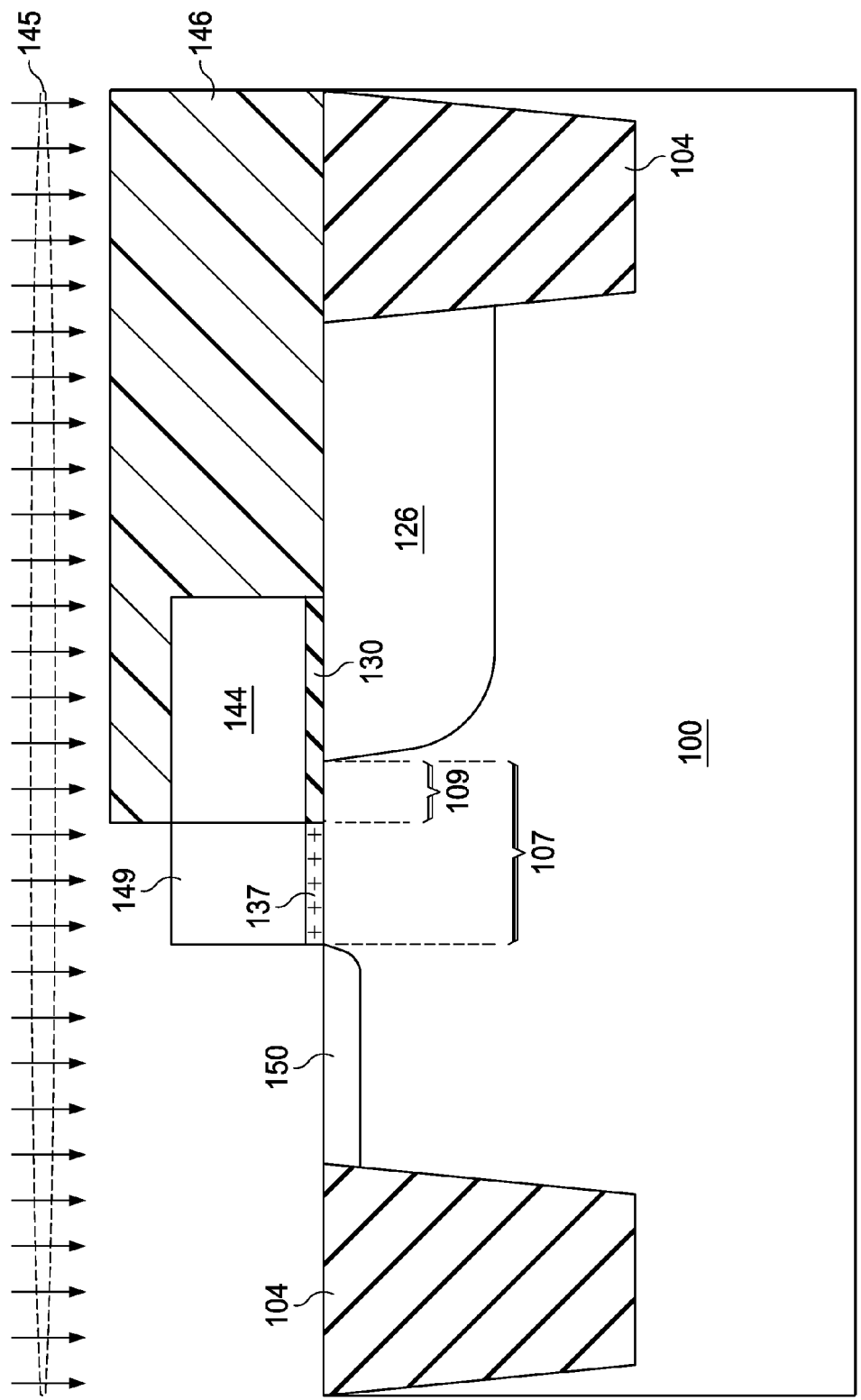
FIG. 5 is an illustration of a step in the fabrication of integrated circuits formed according to principles of the invention.

A second type of embodiment illustrated in FIG. 5 uses an implant to raise the threshold voltage (Vtp) by inducing charge at the gate dielectric substrate interface. For example, nitrogen 145 may be implanted into the PMOS polysilicon transistor gate 142 and a portion 149 of the DEPMOS gate (FIG. 1D) to raise the threshold voltage (Vtp) by introducing charge 137 at the interface between the gate dielectric 130 and the silicon substrate 100. In an example embodiment a nitrogen dose of $1\times10^{13}/cm^2$ to $5\times10^{14}/cm^2$ may be implanted at an n energy of 5-20 keV. The positive charge 137 introduced by the nitrogen implant 145 raises the Vtp of the DEPMOS 199 and PMOS 197 transistors. This in turn allows the halo implant dose 155 to be lowered while still maintaining the specified Vtp, thereby improving the performance of the DEPMOS 199 and PMOS 197 transistors.

Shifting the workfunction of the entire DEPMOS transistor gate 144 instead of a portion 149 as shown in the example embodiment may be detrimental for performance. Shifting the workfunction of the portion of the DEPMOS transistor gate over the drain extension 126 decreases the hole accumulation charge in the drain extension 126 increasing its resistance thus degrading DEPMOS transistor performance. Therefore, confining the indium, carbon, nitrogen and/or halogen implants to a portion 149 adjacent to the source side 150 of the DEPMOS transistors as shown in the example embodiments provides additional performance benefit.

After implanting dopants 145 and 148 to shift the workfunction, the source-drain extension and halo 155 implant steps are now performed. P-type dopants such a boron and BF2 are implanted to form source extension 150 on the DEPMOS transistor 199 and to form the source and drain extensions 151 on the PMOS transistor 197. N-type dopants such as arsenic and/or phosphorus are implanted to form a hallow diffusion 152 around the source diffusion 150 of the DEPMOS transistor 199 and to form halo diffusions 153 around the source and drain extensions 151 of the PMOS transistor 197. The source-drain extension and halo implant steps 155 may also be performed before implanting the workfunction shifting dopants 148.

Figure 4B:
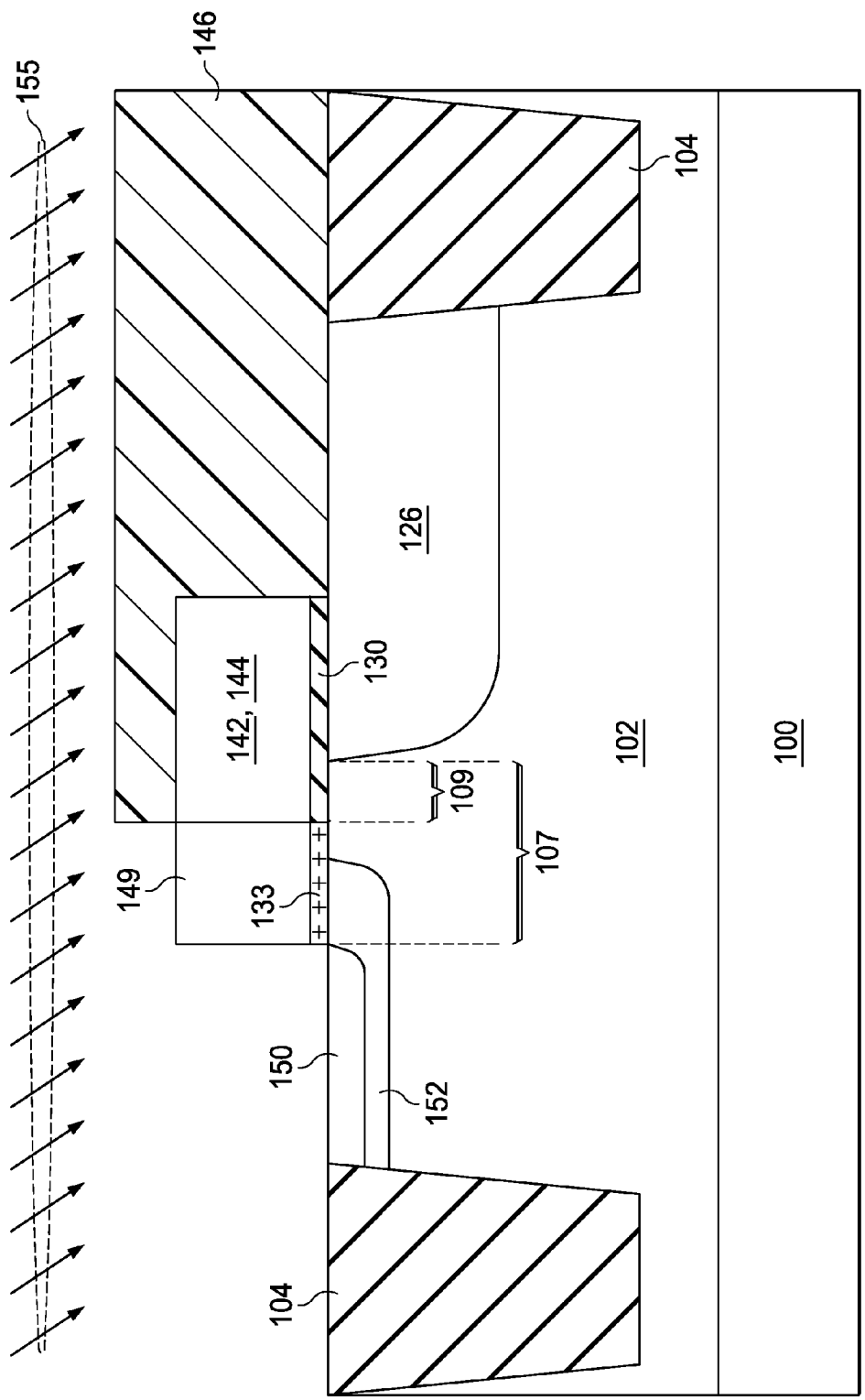

Referring now to the embodiment DEPMOS transistor in FIG. 4B, dopants implanted into a portion 149 of the DEPMOS transistor 199 raise the threshold voltage Vtp of the transistor channel 107 enabling the halo implant dose 155 to be reduced while maintaining the specified Vtp. The lower concentration of the halo dopant decreases carrier scattering thereby improving performance of the PMOS 197 and DEPMOS 199 transistors.

Figure 1E:
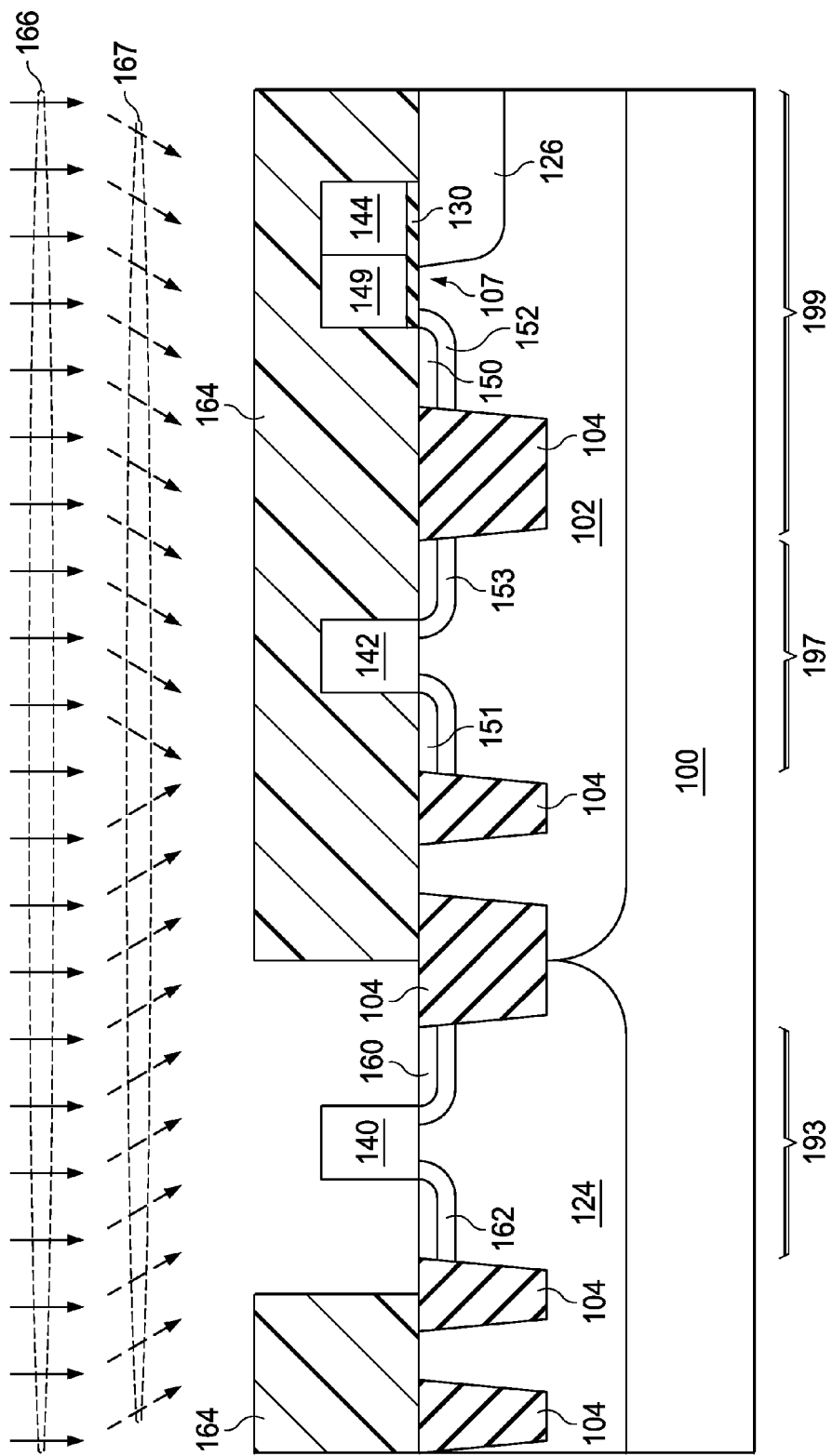

Referring now to FIG. 1E an NMOS source and drain extension photo resist pattern 164 is formed on the integrated circuit and an n-type dopant 166 is implanted to form the source and drain extensions 160 of an NMOS transistor 140. Typically the source and drain extension implants 166 may be phosphorus or arsenic. Dopants such as carbon may be additionally implanted to form sharper source and drain extension junctions.

A p-type angled implant 167 is then implanted using the same photo resist pattern 164 to form halo diffusions 162 under the edges of the NMOS transistor gate 140. The halo implants set the threshold voltage (Vtn) of the NMOS transistor 140.

Figure 1F:
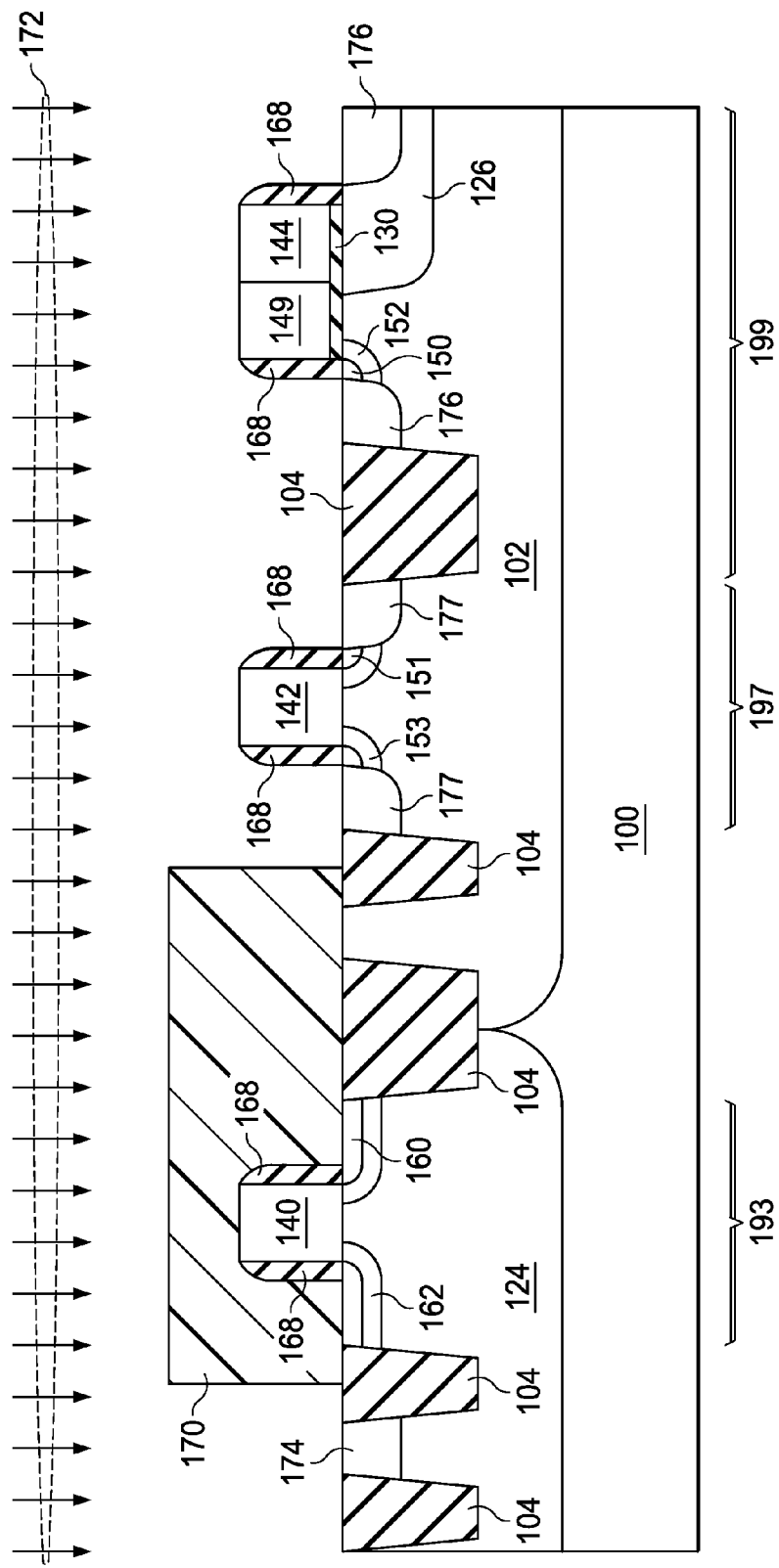

FIG. 1F shows the integrated circuit after sidewalls 168 are formed on the transistors and a PMOS transistor source and drain photo resist pattern 170 is formed. P-type dopant 172 is implanted to form the DEPMOS transistor 144 deep source and drain diffusions 176 and the PMOS transistor 142 deep source and drain diffusions 177. The p-type dopant 172 also may form a low resistance contact 174 to the pwell 124.

Figure 1G:
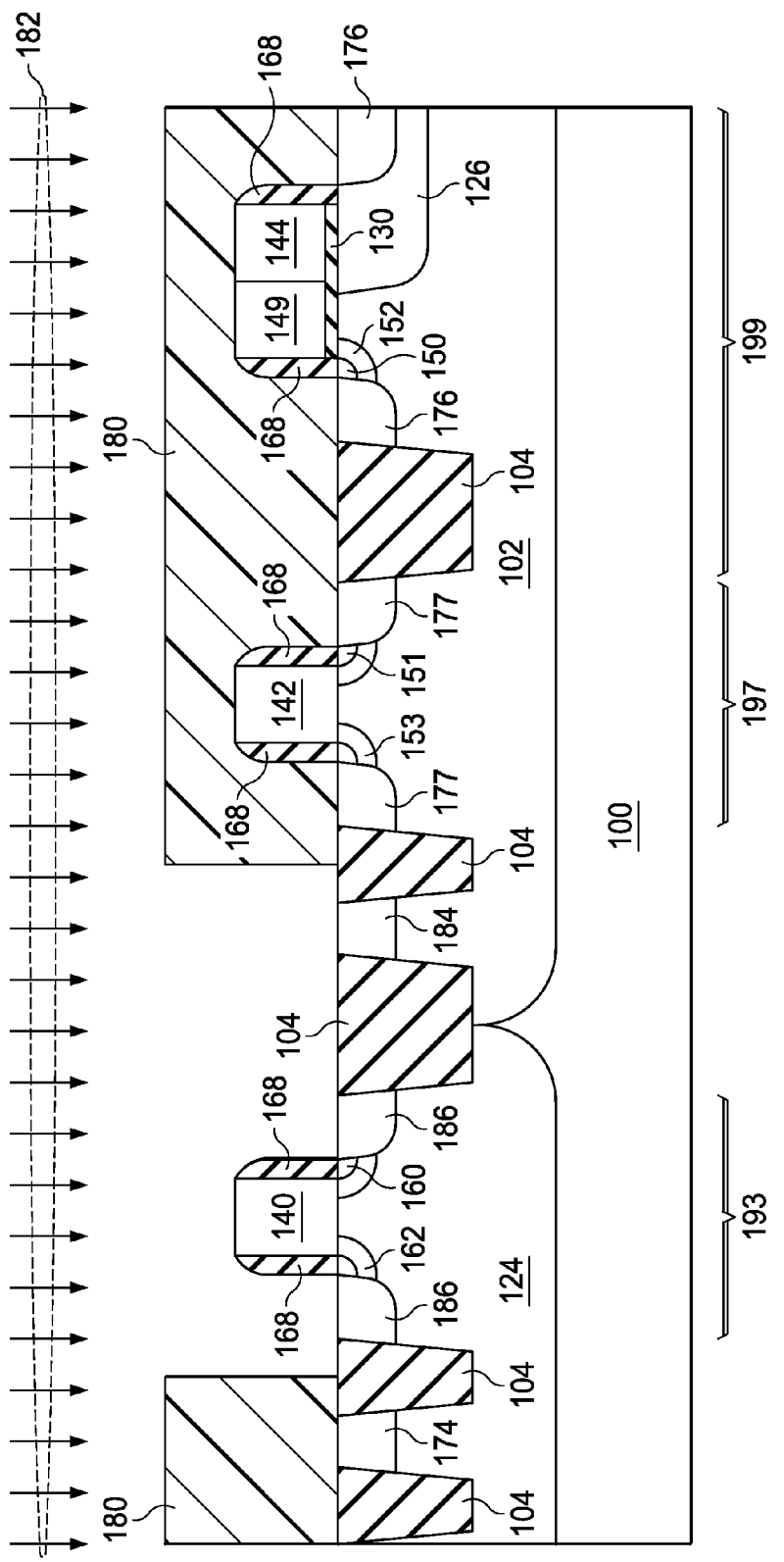

Referring now to FIG. 1G, an NMOS transistor source and drain photo resist pattern 180 is formed on the integrated circuit and n-type dopant 182 is implanted to form the deep source and drain diffusions 186 on the NMOS transistor 140 and the low resistance contact 184 to the nwell 102.

Figure 1H:
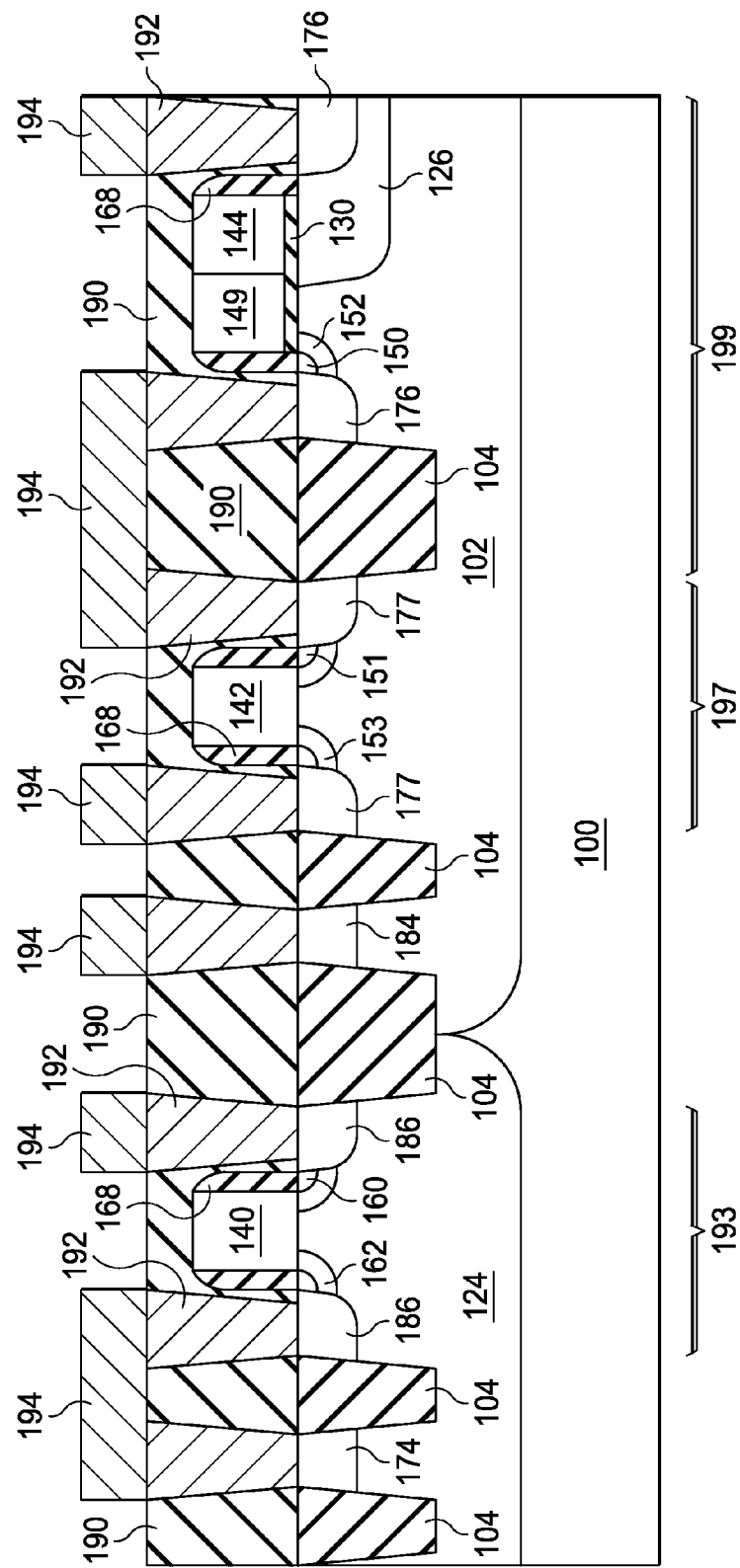

In FIG. 1H premetal dielectric (PMD) 190 is deposited and planarized and contact plugs 192 form electrical contact between the transistor deep source and drain diffusions 176, 177, and 186 and interconnect 194. Electrical contact is also formed between the substrate contacts 174 and 184 and interconnect 194. The PMD 190 may be composed of multiple dielectric layers such as silicon nitride contact etch stop layer or dual stress liner layers plus HARP (high aspect ratio) silicon dioxide gap fill dielectric plus doped or undoped PECVD or HDP silicon dioxide. The contact plugs 192 may be CVD tungsten and the interconnect layer 194 may be an aluminum alloy or copper.

Figure 2:
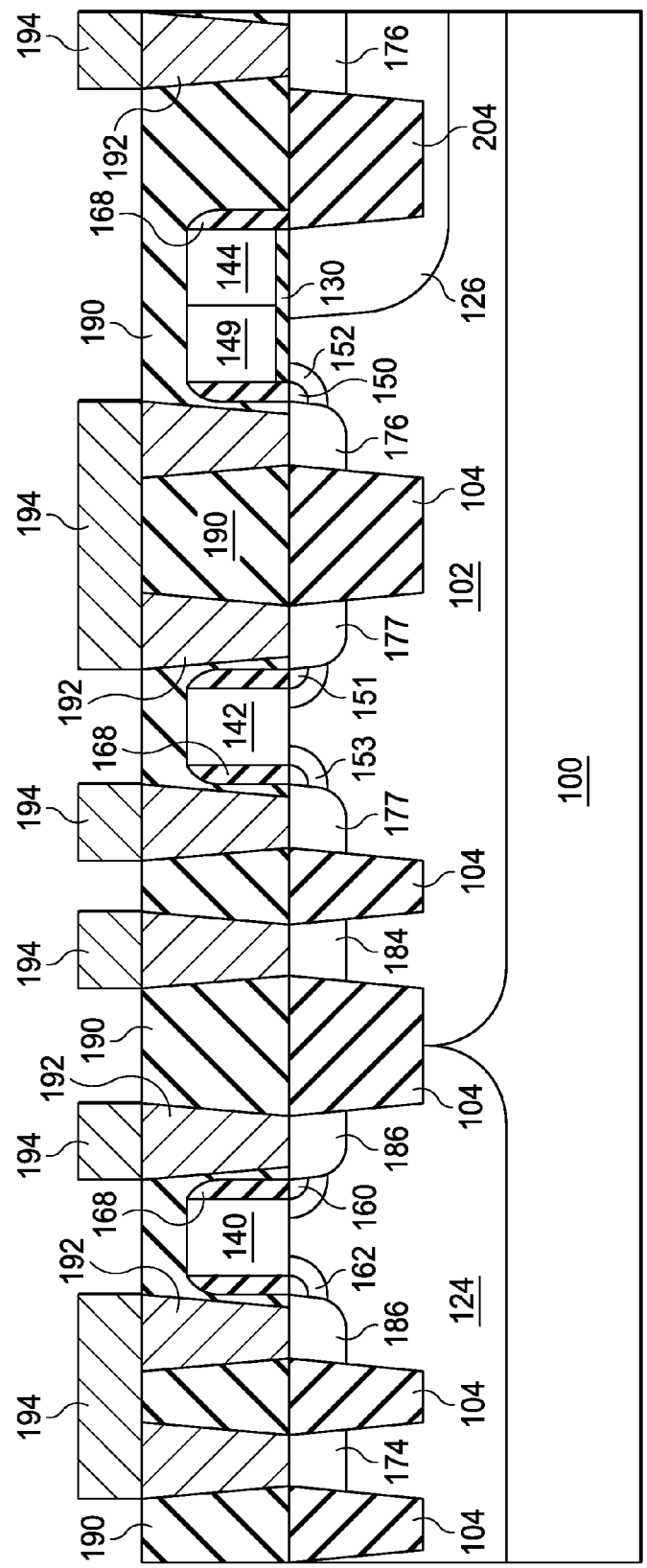
FIG. 2 is a cross section of a DEPMOS transistor formed according to principles of the invention.

FIG. 2 shows an alternate embodiment DEMOS transistor with an STI dielectric geometry 204 in the extended drain 126. The STI dielectric may be used to increase the distance between the drain contact 176 and the DEMOS transistor 144 gate dielectric 130. There is a larger voltage drop across the increased distance enabling the DEMOS transistor 144 with the low voltage dielectric 130 to switch a higher voltage.

The embodiment in FIGS. 1A through 1H, FIG. 2 and FIGS. 4A and 4B illustrates the simultaneous formation of an embodiment DEPMOS transistor 144 and PMOS transistor 142 which may be a core PMOS transistor or an input/output PMOS transistor.

Figure 3:
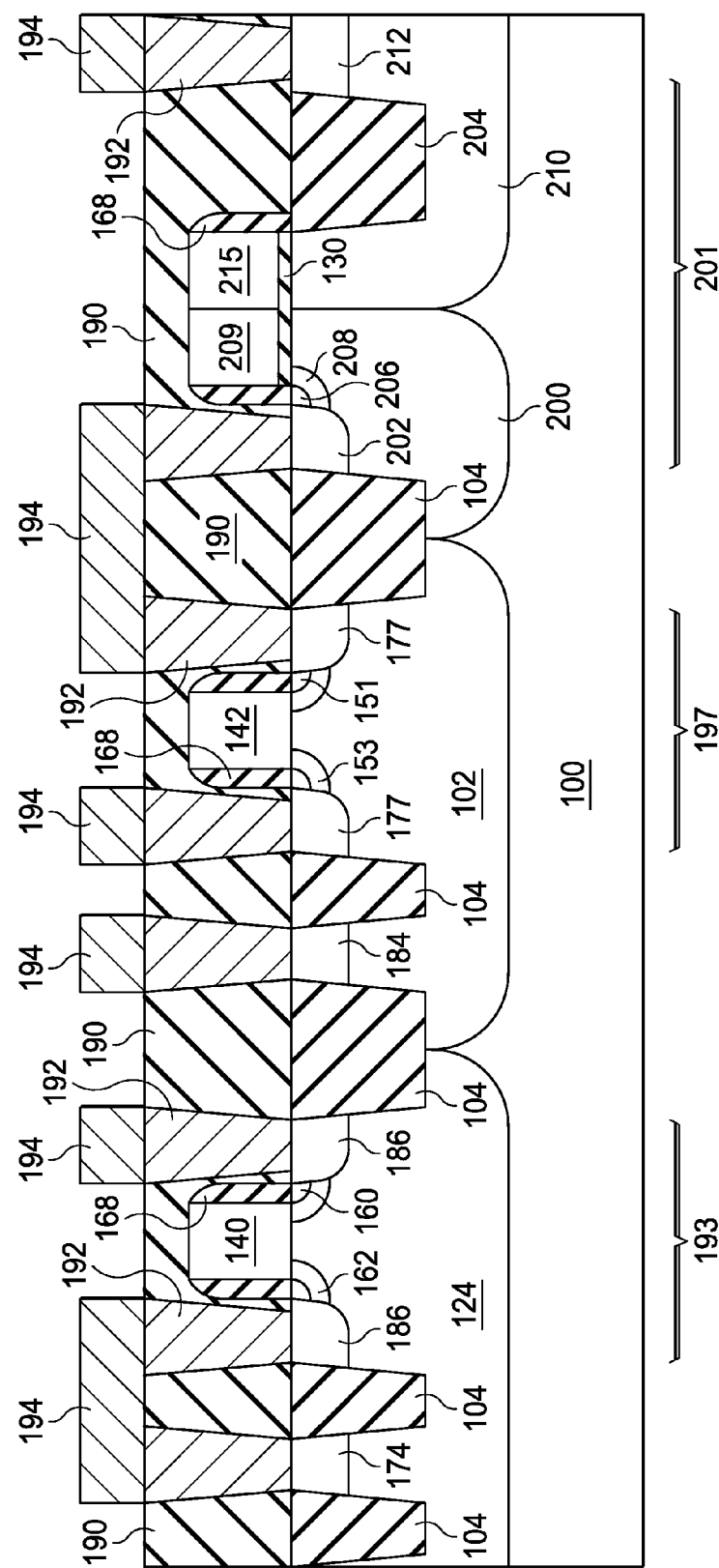
FIG. 3 is a cross section of a DENMOS transistor formed according to principles of the invention.

Embodiment DENMOS transistors and NMOS transistors may be simultaneously formed in a manner similar to that illustrated for DEPMOS and PMOS transistors. An integrated circuit with an embodiment DENMOS transistor 201 is illustrated in FIG. 3. The extended drain 210 of the DENMOS 201 is formed simultaneously with the formation of nwell 102. The pwell 200 on the source side is formed simultaneously with pwell 124. The source side drain extension 206 and halo 208 are formed simultaneously with the source and drain extensions 160 and 162 on NMOS transistor 140.

Figure 6:
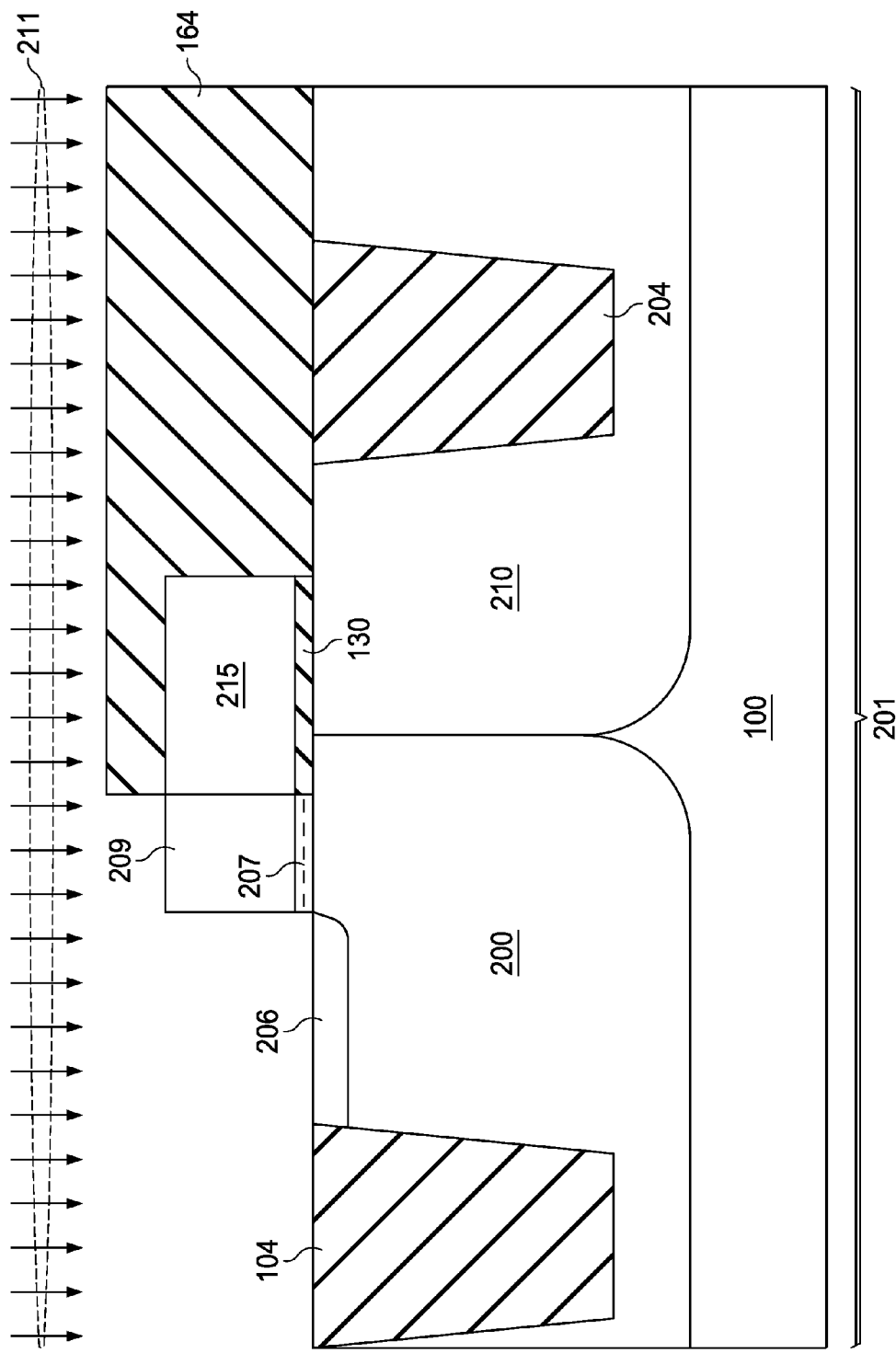
FIG. 6 is an illustration of a step in the fabrication of integrated circuits formed according to principles of the invention.

As shown in FIG. 6 a dopant 211 may be implanted using the NMOS drain extension mask 164 to dope a portion 209 of the DENMOS transistor gate 215 to raise the Vtn of the transistor in the implanted region 209. In an embodiment DENMOS transistor 201, a dopant such as fluorine is implanted to introduce negative charge 207 in the gate dielectric 130. In an example embodiment a fluorine dose of $1 \times 10^{14}/cm^2$ to $2 \times 10^{16}/cm^2$ may be implanted at energy of 1-10 keV into the 100 nm thick polysilicon gate. The negative charge 207 induced by the fluorine implant raises the Vtn of the DENMOS transistor 201. This allows a lower halo dopant concentration 208 (FIG. 3) to be used while maintaining the specified Vtn, thereby improving the performance of the DENMOS transistor 201. The fluorine implant may also be performed simultaneously on the NMOS transistor 193 (FIG. 3) to improve its performance.

Steps in an example embodiment process flow which builds NMOS transistors and LDNMOS transistors with improved performance are illustrated in FIGS. 7A through 7I, and FIG. 8.

Figure 7A:
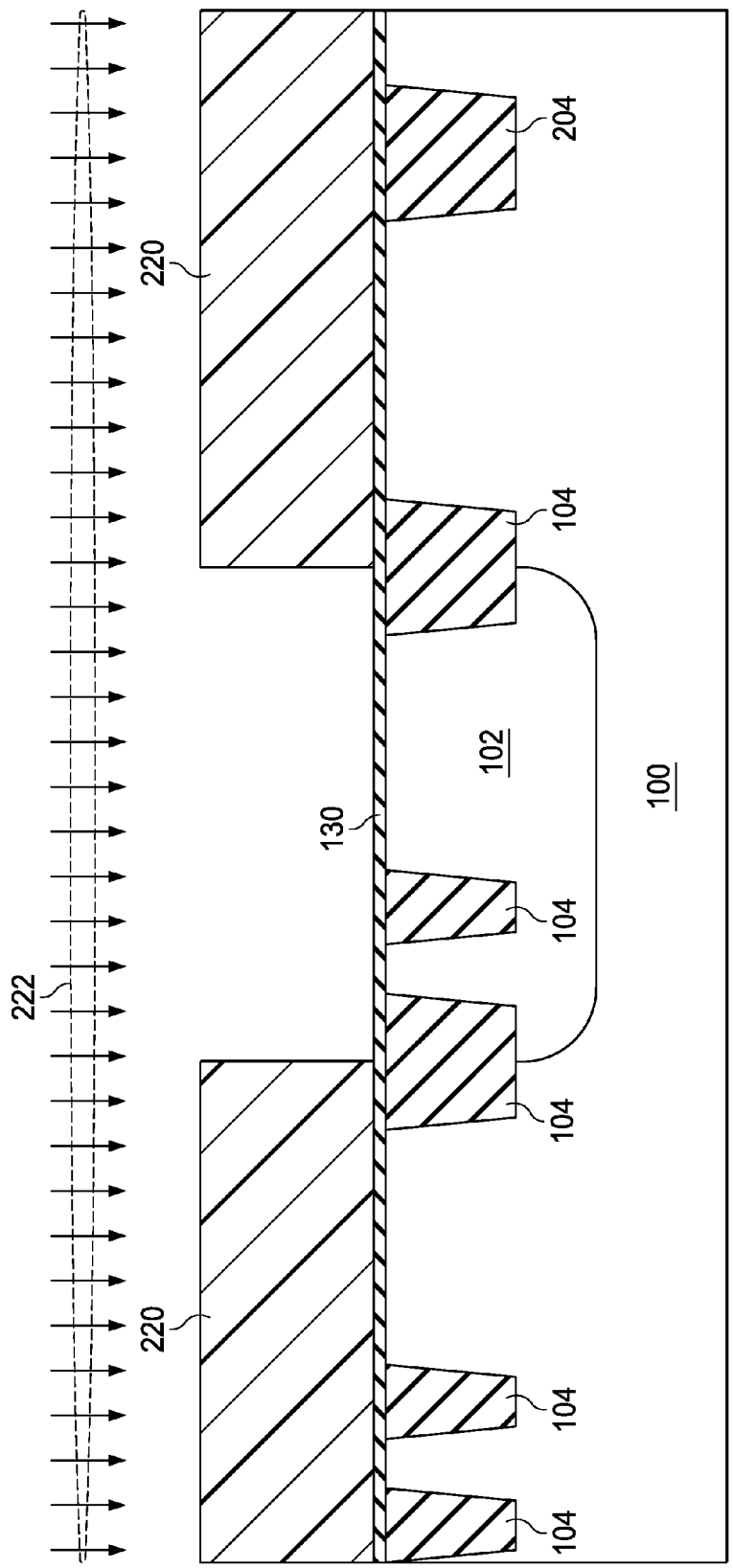
FIGS. 7A-7J are illustrations of steps in the fabrication of integrated circuits with LDNMOS transistors formed according to principles of the invention.

FIG. 7A shows a partially processed integrated circuit wafer. Shallow trench isolation (STI) dielectric 104 forms isolation between transistors and other devices on the integrated circuit wafer. STI dielectric 204 is optional. In this example embodiment STI dielectric 204 enables the formation of a longer lateral drain so that a higher voltage to be switched. An NWELL photoresist pattern 220 is formed on the wafer and n-type dopant 222 is implanted to form nwell 102.

Figure 7B:
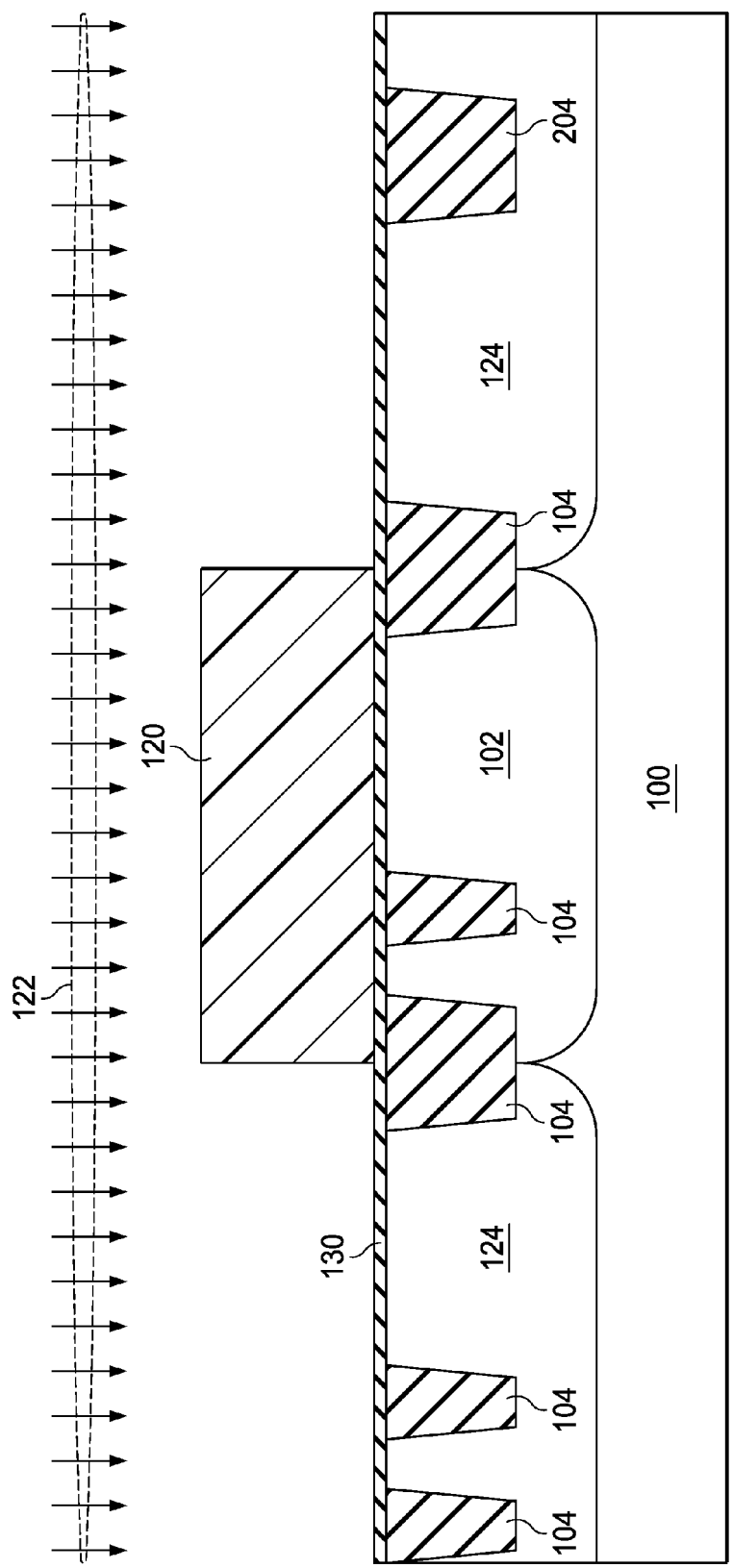

In FIG. 7B an optional pwell photo resist pattern 120 may be formed on the integrated circuit and p-type dopant 122 may be implanted to form pwells 124.

Figure 7C:
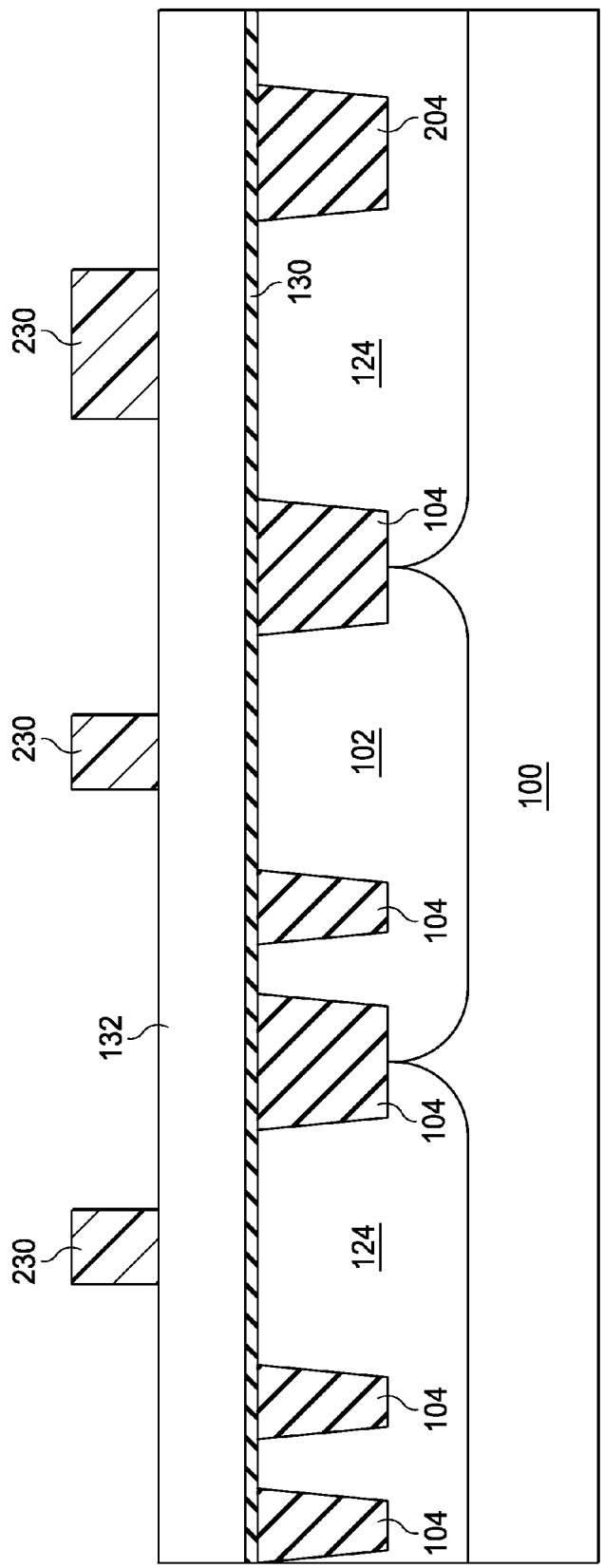

Gate dielectric 130 is then formed and polysilicon gate material 132 is deposited on the integrated circuit wafer as shown in FIG. 7C. The gate dielectric 130 may be thermally grown silicon dioxide, nitrided silicon dioxide, silicon oxynitride, or a high-k dielectric. A transistor gate photo resist pattern 230 is formed on the polysilicon gate layer 132.

Figure 7D:
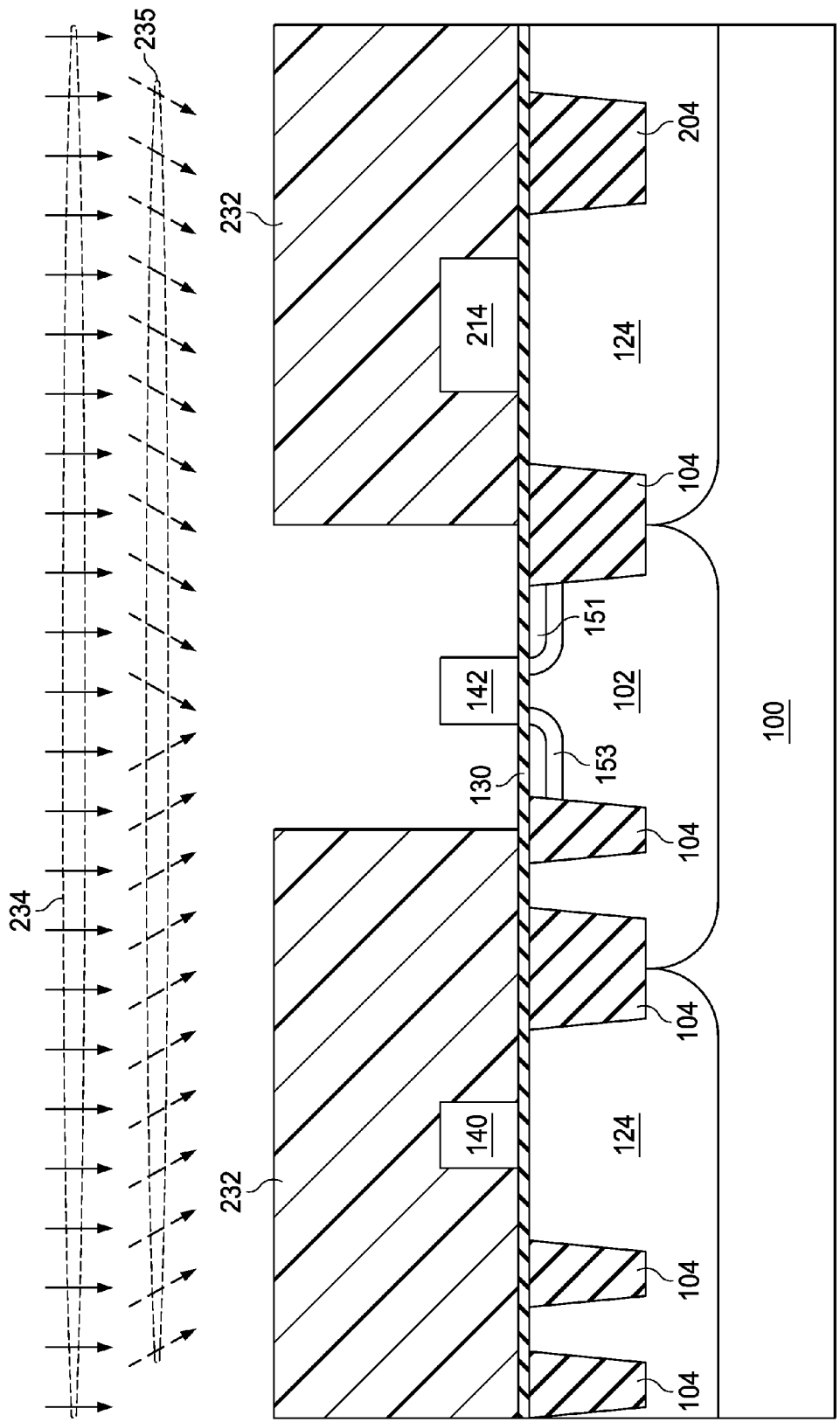

Referring now to FIG. 7D, after the gates 140, 142, and 214 are etched, a PMOS source and drain extension photo resist pattern 232 is formed on the integrated circuit wafer, and p-type PMOS source extension implant 234 is implanted to form source and drain extensions 151 on the PMOS transistor 142. Typically the p-type PMOS source and drain extension implant 234 is boron or BF2.

As shown in FIG. 7D, an n-type dopant 235 may be implanted at an angle to form halo diffusions 153 around the source and drain diffusions 151 of the PMOS transistor 142.

Figure 7E:
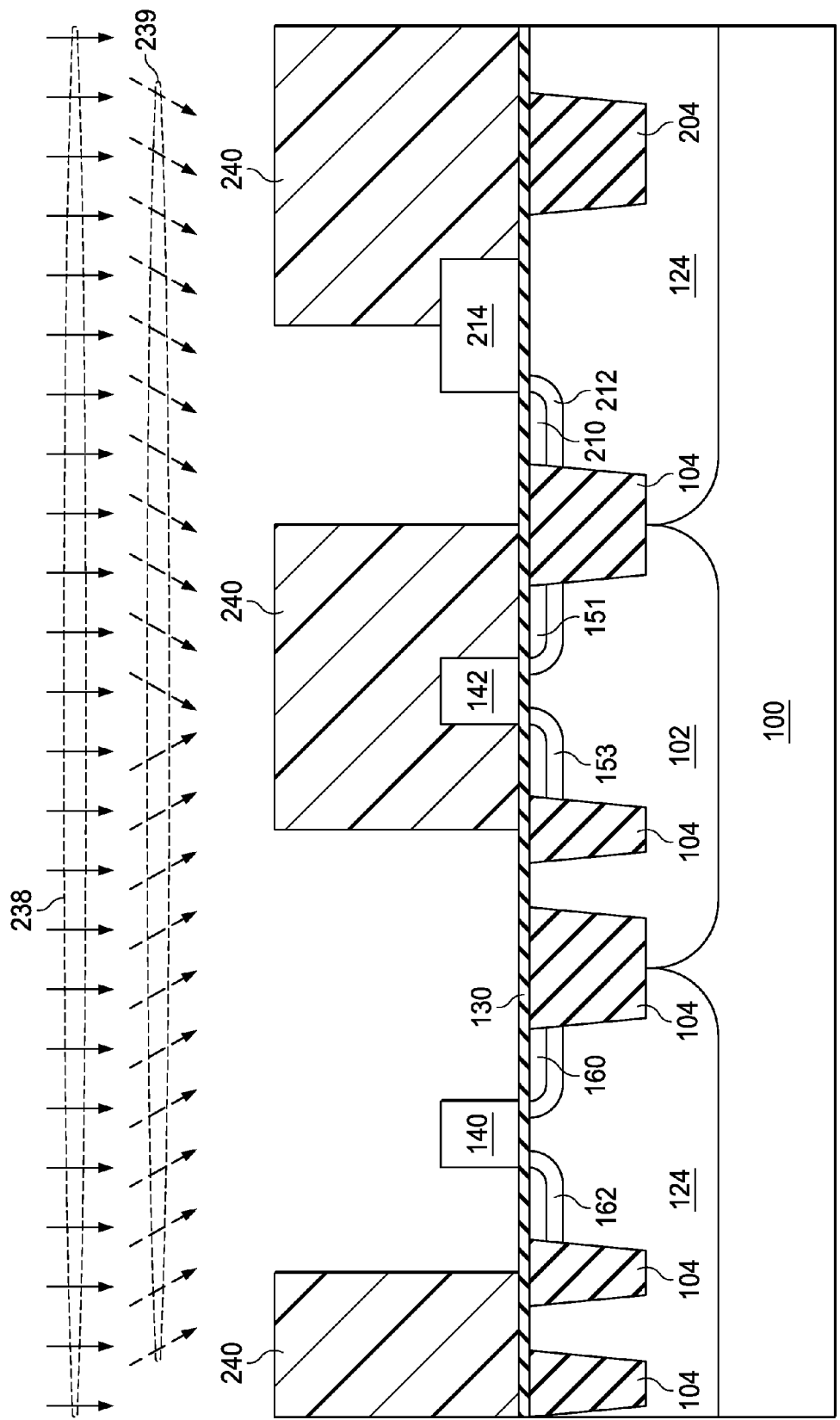

Referring now to FIG. 7E an NMOS source and drain extension photo resist pattern 240 is formed on the integrated circuit and an n-type dopant 238 is implanted to form the source and drain extensions 160 of an NMOS transistor 140 and the source extension 210 on the LDNMOS transistor 214. Typically the source and drain extension implants may be phosphorus or arsenic. Dopants such as carbon may be additionally implanted to form sharper source and drain extension junctions 160 and 210.

As shown in FIG. 7E, a p-type angled implant 239 is then implanted using the same photoresist pattern 240 to form halo diffusions 162 under the edges of the NMOS transistor gate 140 and to form a halo diffusion 212 under the gate 214 adjacent to the source extension 210 of the LDNMOS transistor 214.

Figure 7F:
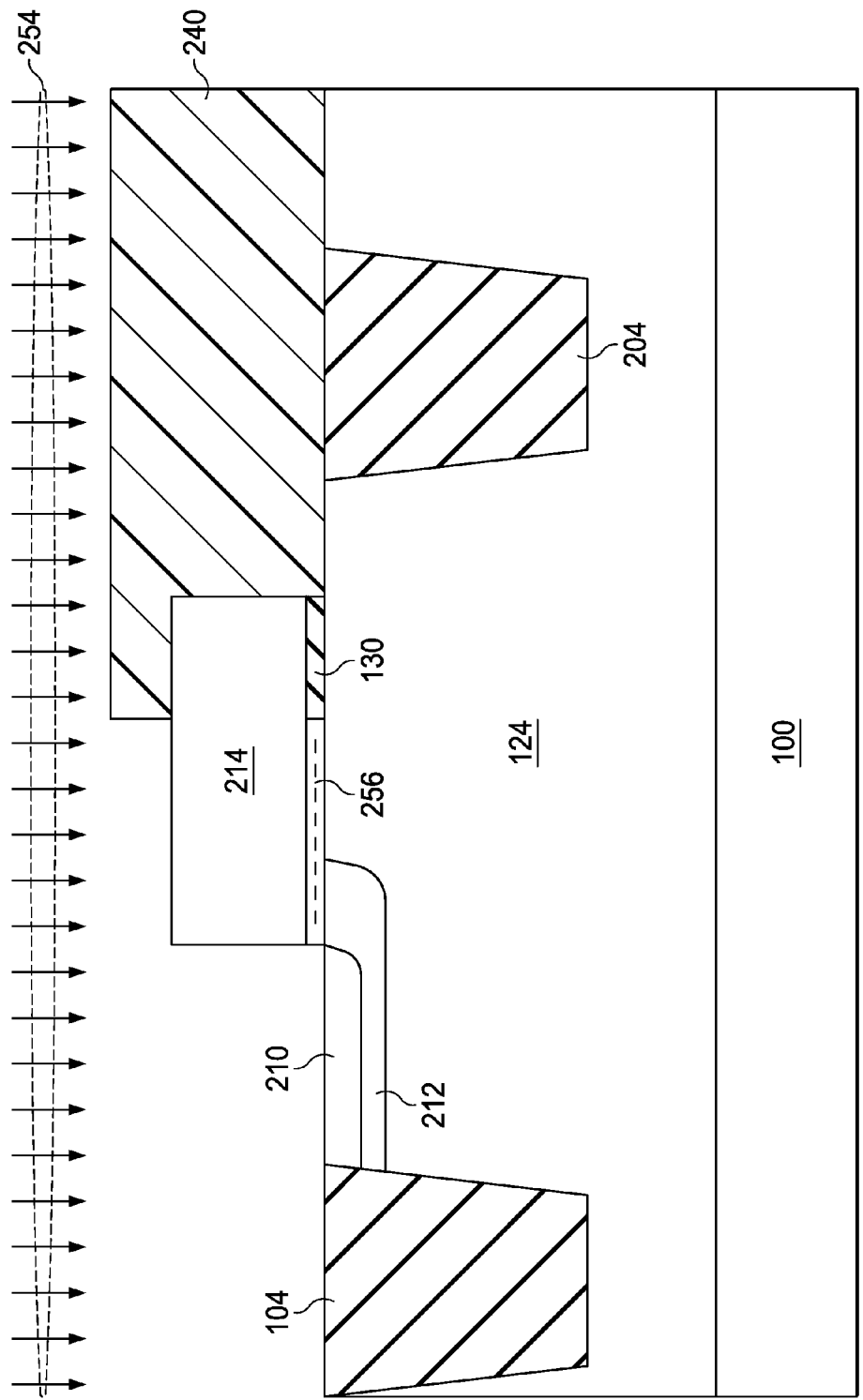

FIG. 7F shows the LDNMOS portion of the integrated circuit and illustrates an embodiment in which a halogen dopant 254 such as fluorine is implanted to induce a negative charge 256 in the gate dielectric 130. This negative charge raises the threshold voltage, Vtn, of the LDNMOS and NMOS transistors enabling a lower dopant concentration in the halo diffusion 212. The lower halo dopant concentration reduces carrier scattering and improves LDNMOS 214 and NMOS 140 transistor performance.

Figure 7G:
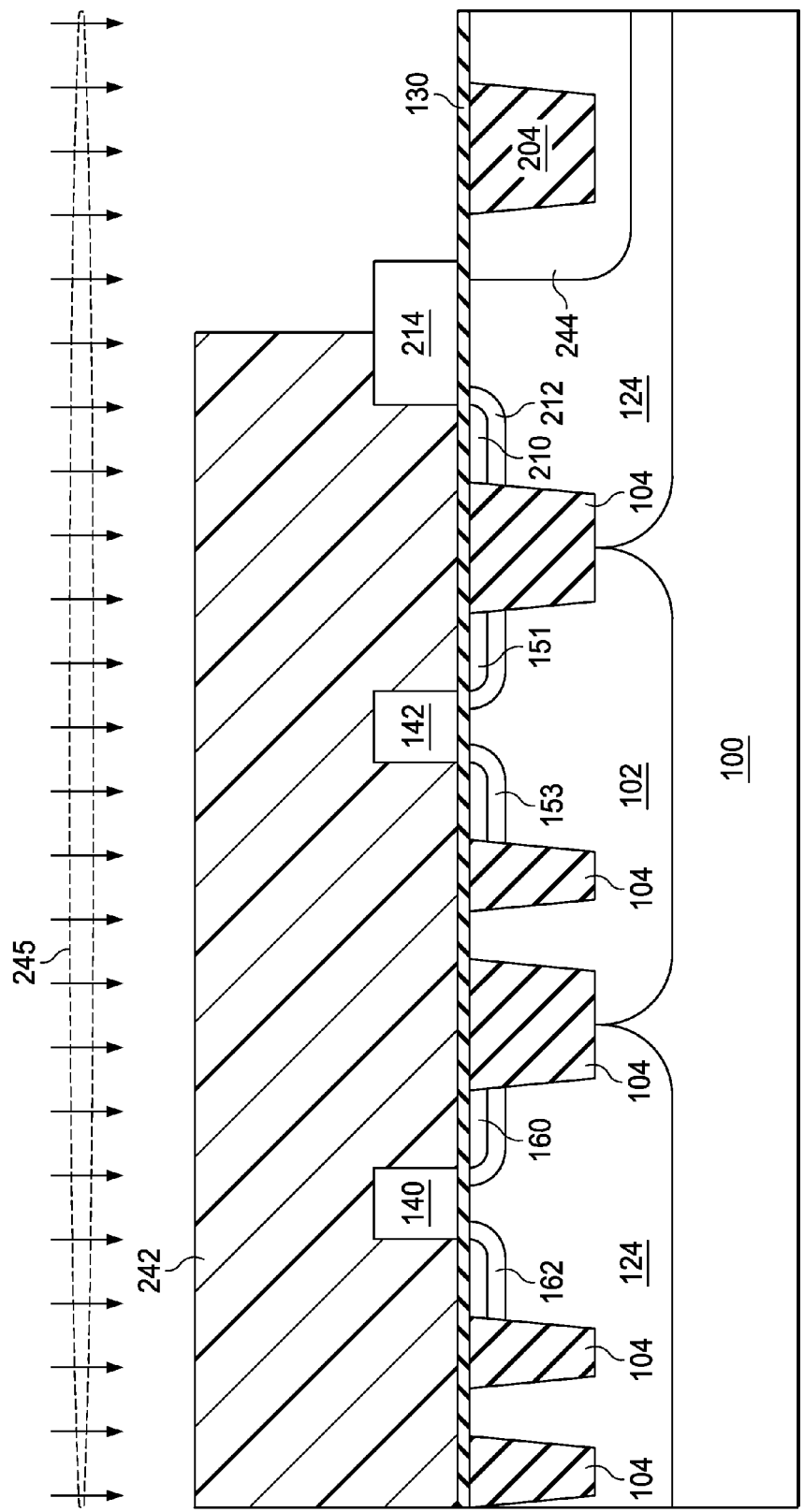

In FIG. 7G an LDNMOS extended drain photo pattern 242 is formed on the integrated circuit n-type LDNMOS extended drain dopant 245 is implanted to form the lateral extended drain 244. In this embodiment the dopant 245 is implanted sufficiently deep to form a diffusion under the STI dielectric 204 in the lateral extended drain 244. Halo doping is optional and may also be implanted using the LDNMOS extended drain photo pattern 242. The LDNMOS extended drain dopant 245 plus the optional halo doping may be implanted self aligned to a NMOS transistor gate to form a NMOS transistor elsewhere in the integrated circuit.

Figure 7H:
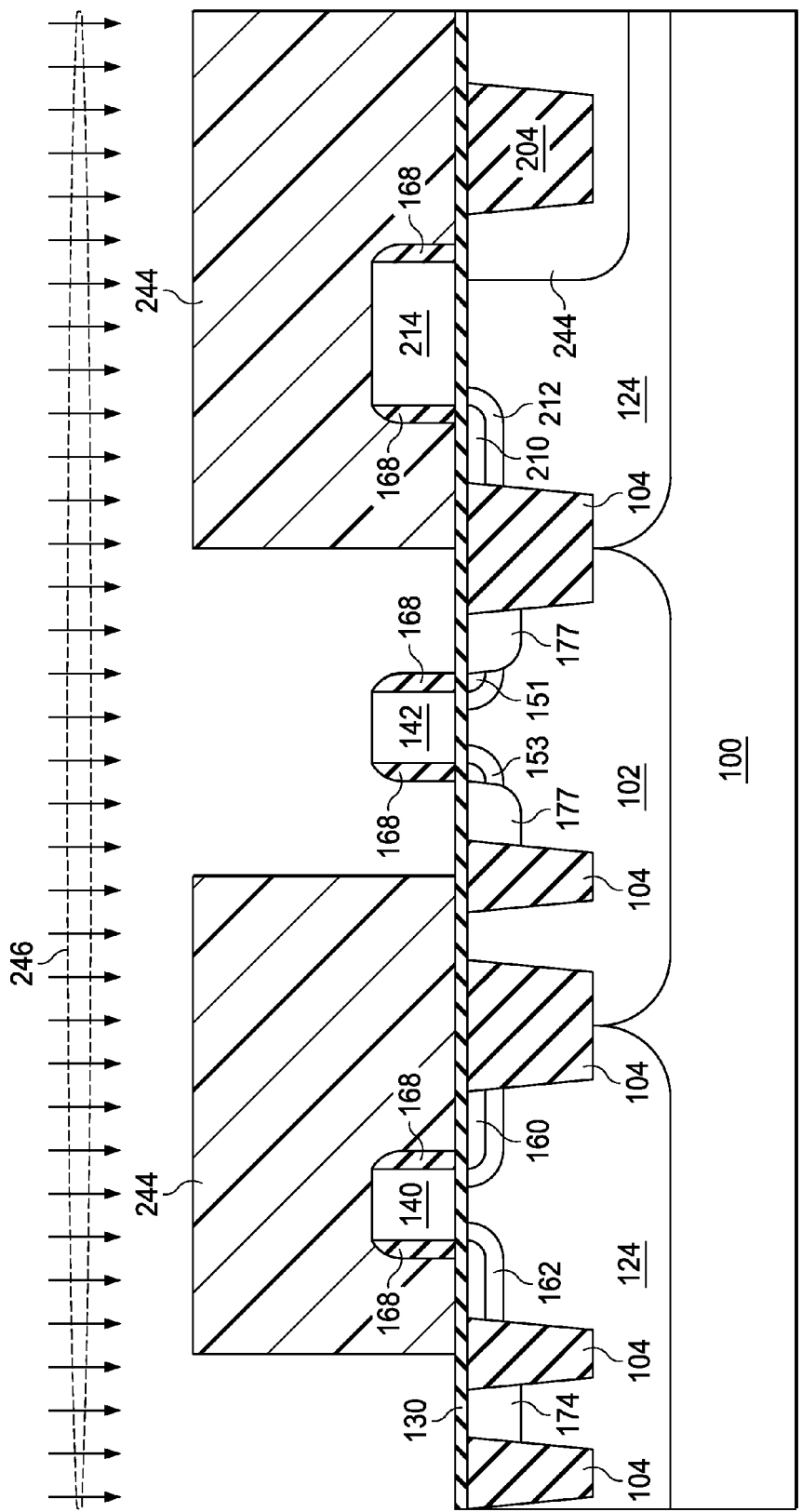

FIG. 7H shows the integrated circuit after sidewalls 168 are formed on the transistors and a PMOS transistor source and drain photo resist pattern 244 is formed. P-type dopant 246 is implanted to form the PMOS transistor 142 deep source and drain diffusions 177. The p-type dopant 246 also may form a low resistance contact 174 to the pwell 100.

Figure 7I:
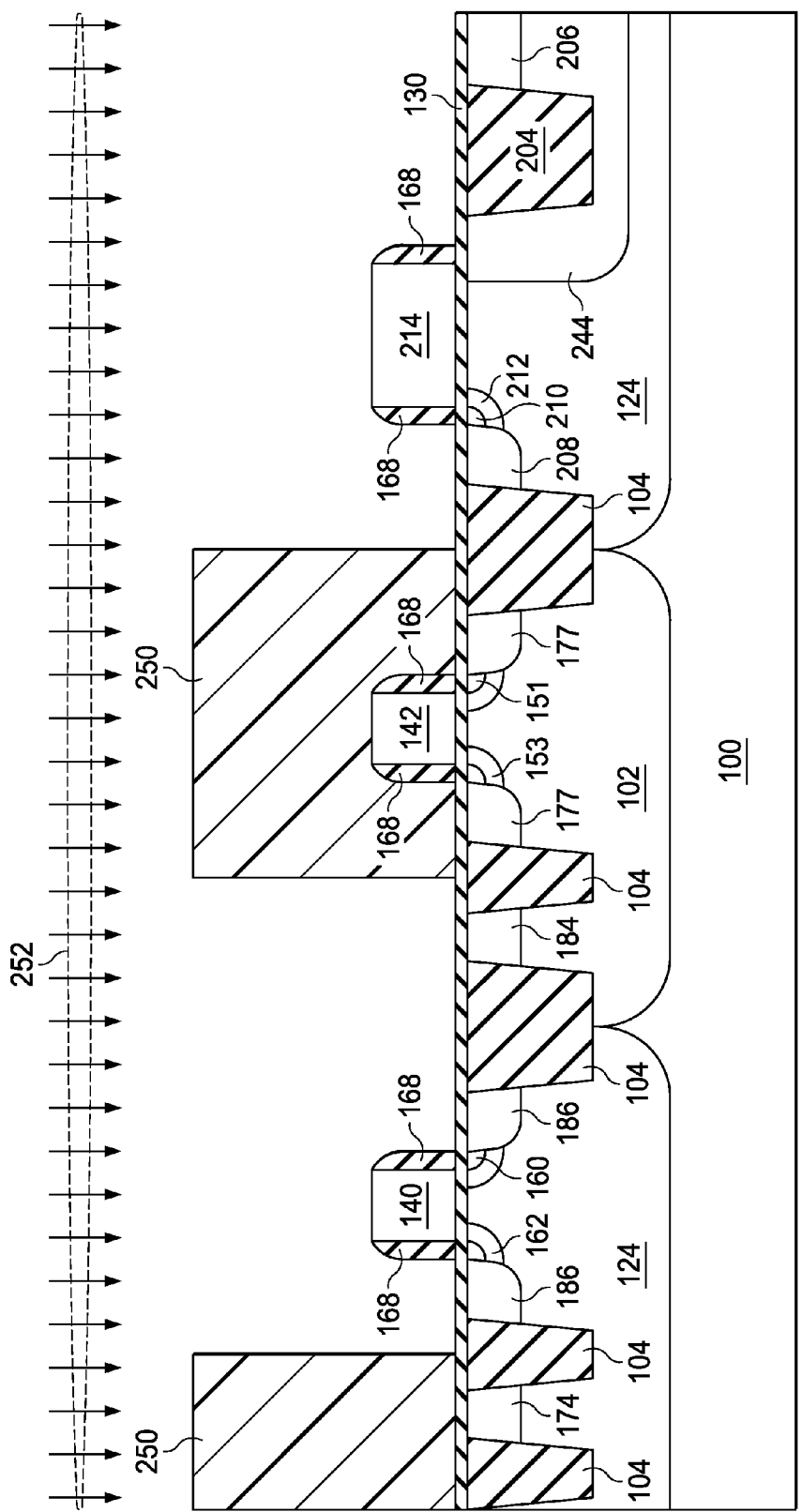

Referring now to FIG. 7I, an NMOS transistor source and drain photo resist pattern 250 is formed on the integrated circuit and n-type dopant 252 is implanted to form the deep diffusion 208 to LDNMOS transistor source and to form the deep contact diffusion 206 to the lateral extended drain 244. This implant 252 also forms the deep source and drain diffusions 186 on the NMOS transistor 140 and forms the low resistance contact 184 to the nwell 102.

Figure 7J:
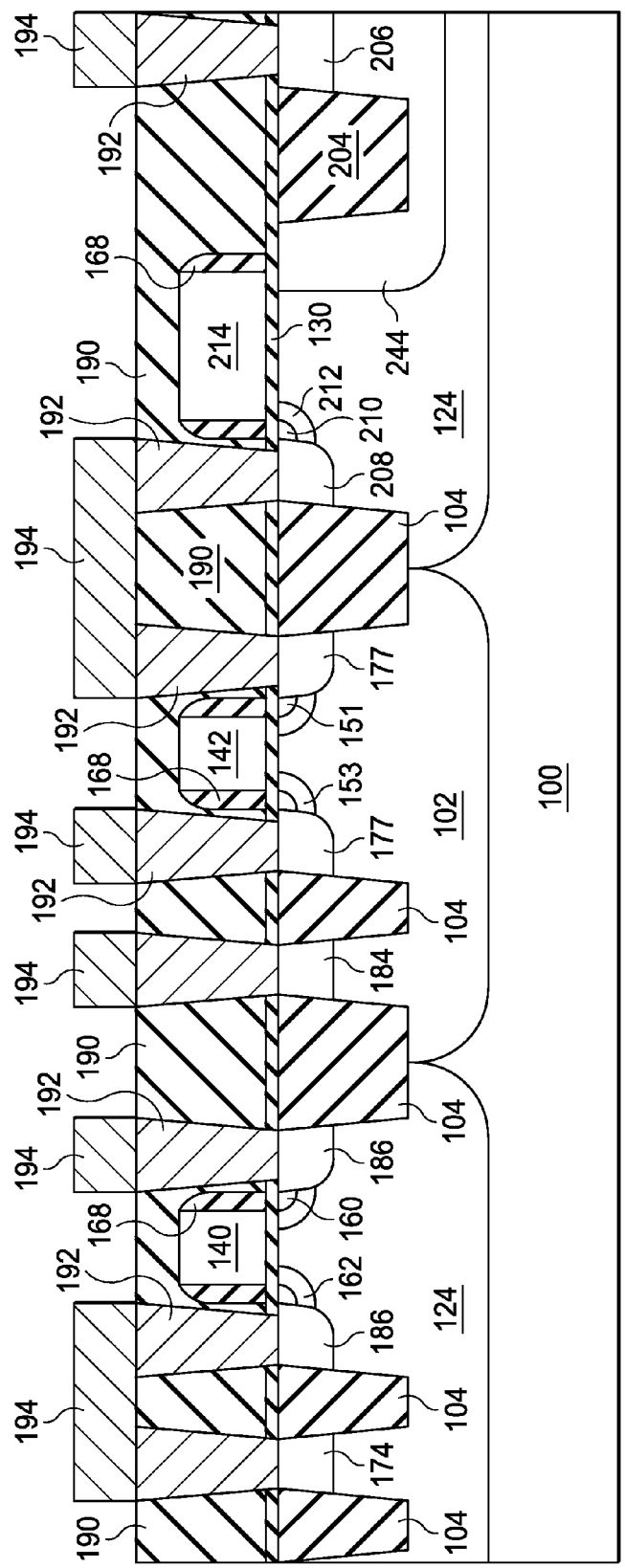

In FIG. 7J premetal dielectric (PMD) 190 is deposited and planarized and contact plugs 192 form electrical contact between the transistor deep source and drain diffusions 186, 177, 206, and 208 and interconnect 194. Electrical contact is also formed between the substrate contacts 174 and 184 and interconnect 194. The PMD may be composed of multiple dielectric layers such as silicon nitride contact etch stop layer or dual stress liner layers plus HARP (high aspect ratio) silicon dioxide gap fill dielectric plus doped or undoped PECVD or HDP silicon dioxide. The contact plugs 192 may be CVD tungsten and the interconnect layer 194 may be an aluminum alloy or copper.

Figure 8:
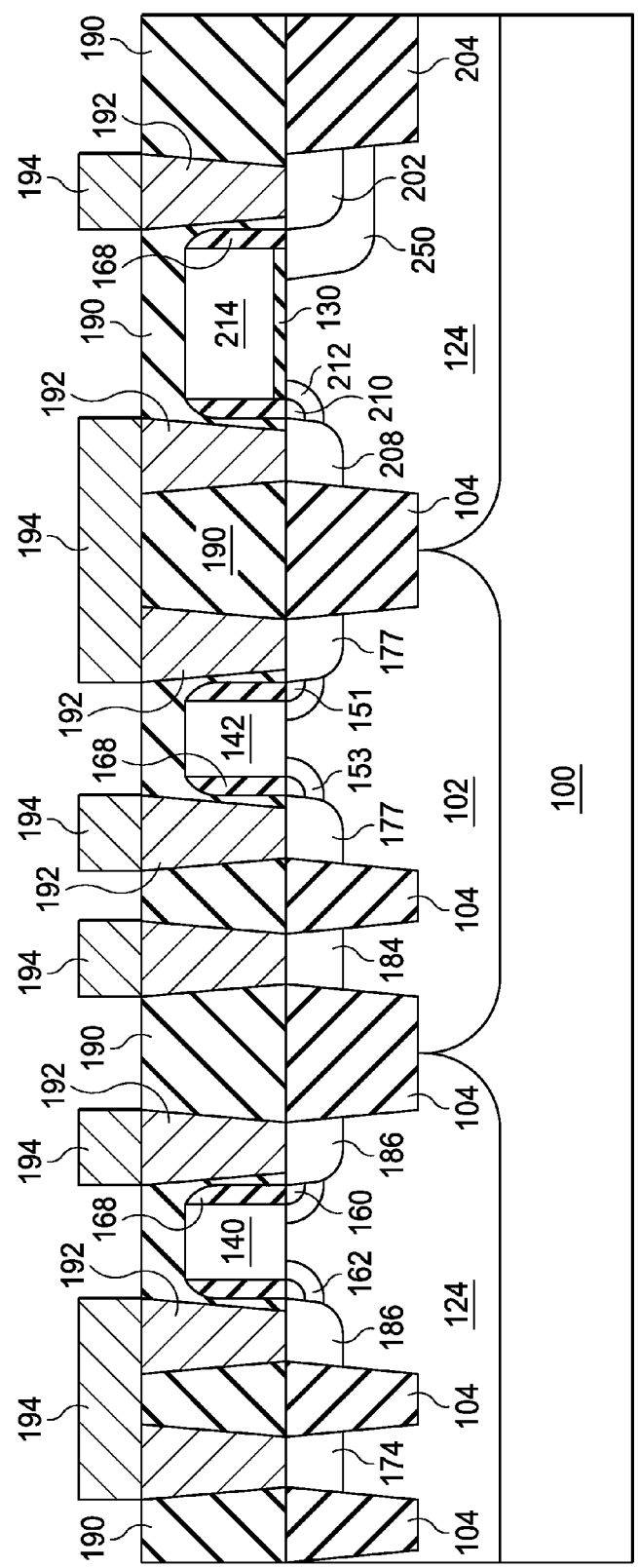
FIG. 8 is a cross section of an LDNMOS transistor formed according to principles of the invention.

An alternative embodiment LDNMOS transistor is illustrated in FIG. 8 The LDNMOS is constructed without STI geometry in the lateral extended drain 250. Because the lateral extended drain 250 does not need to be deeper than the STI dielectric geometry 204 in this embodiment, a lower energy may be used when implanting the lateral extended drain dopant 245. The shallower lateral extended drain 250 may be preferred if it is also being used to build NMOS transistors elsewhere in the circuit. A shallower lateral extended drain 250 reduces short channel effects when used for NMOS transistors.

The embodiment illustrated in FIGS. 7A through 7J and FIG. 8 simultaneous forms an embodiment LDNMOS transistor 214 and a NMOS transistor 140 which may be a core NMOS transistor or an input/output NMOS transistor.

Embodiment LDPMOS transistors and PMOS transistors may be simultaneously formed in a manner similar to that illustrated for LDNMOS and NMOS transistors. The doping types would be reversed in FIGS. 6A through 6I to form embodiment LDPMOS transistors and to form embodiment PMOS transistors.

For example, to form embodiment LDPMOS transistors and embodiment PMOS transistors the substrate 100 in FIG. 7J is n-type and the lateral drain 244 is p-type.

For an embodiment LDPMOS transistor the source extension 210 implant dopant is an p-type dopant such as boron or BF2. As shown in FIG. 7F in an embodiment LDPMOS transistor, a dopant species 238 such as indium, indium plus carbon, indium plus carbon plus a halogen such as fluorine, chlorine, bromine, iodine, or astatine may be implanted to raise the Vtp by lowering the workfunction of the gate 214. Alternatively or additionally nitrogen may be implanted to induce a positive charge in the gate dielectric 130 to raise the Vtp.

Those skilled in the art to which this invention relates will appreciate that many other embodiments and variations are possible within the scope of the claimed invention.

What is claimed is:

1. A process for forming an integrated circuit, comprising the steps:
   forming a first polysilicon gate of a MOS transistor;
   forming an extended drain of a DEMOS transistor;
   forming a second polysilicon gate of said DEMOS transistor where a portion of said second polysilicon gate overlies an edge of said extended drain;
   forming a source and drain extension photoresist pattern that opens a source side and drain side of said MOS transistor and opens a source side of said DEMOS transistor and opens a major portion of said second polysilicon gate that overlies a channel of said DEMOS transistor but covers a drain side of said DEMOS transistor; and
   implanting said first polysilicon gate and said major portion with at least one dopant selected from the group indium, carbon, nitrogen, and halogen that raises a threshold voltage of said DEMOS transistor.

2. The process of claim 1 where said major portion includes all of said channel and a portion of said second polysilicon gate overlying said extended drain.

3. The process of claim 1 further comprising the steps:
   forming an nwell in a p-type substrate of said integrated circuit.
   forming a lightly doped isolated pwell contained in said nwell where said lightly doped isolated pwell is said extended drain;
   where said MOS transistor is a PMOS transistor; and
   where said DEMOS transistor is a DEPMOS transistor.

4. The process of claim 1 further comprising the steps:
   forming an nwell in a p-type substrate of said integrated circuit.
   where said MOS transistor is an NMOS transistor;
   where said DEMOS transistor is a DENMOS transistor;
   where said lightly doped extended drain is said nwell; and
   where said at least one dopant is fluorine.

5. A process for forming an integrated circuit, comprising the steps:
   forming STI isolation in said substrate;
   forming a MOS transistor gate on said substrate;
   forming an LDMOS transistor gate on said substrate;
   forming a drain extension photo resist pattern with a first opening over said MOS transistor gate and with a second opening over a source side of said LDMOS transistor gate where said second opening exposes a portion of said source side of said LDMOS transistor gate that extends at least as far as a halo diffusion on said source side of said LDMOS transistor gate;
   implanting source and drain extension implants and halo implants into a source side and a drain side of said MOS transistor and into said source side of said LDMOS transistor;
   implanting at least one dopant selected from the group indium, carbon, nitrogen, and a halogen to raise the threshold voltage of said LDMOS transistor gate in said second opening;

forming an LDMOS extended drain photo resist pattern with an opening over a drain side of said LDMOS transistor gate; and implanting LDMOS extended drain dopant to form an LDMOS extended drain.

6. The process of claim 5 where said portion of said gate also includes a portion of said gate overlying said extended drain diffusion.

7. The process of claim 5 further comprising the steps:
providing an n-type substrate;
implanting an p-type dopant to form said LDMOS extended drain where said LDMOS transistor is a LDPMOS transistor;
implanting p-type dopants to form said source and drain extensions on said MOS transistor and where said MOS transistor is a PMOS transistor;
implanting said source side of said LDPMOS transistor gate with at least one dopant selected from the group indium, carbon, nitrogen, and a halogen to raise the threshold voltage of said LDPMOS transistor.

8. The process of claim 5 further comprising the steps:
providing a p-type substrate;
implanting an n-type dopant to form said LDMOS extended drain where said LDMOS transistor is a LDNMOS transistor;
implanting n-type dopants to form said source and drain extensions on said MOS transistor and where said MOS transistor is a NMOS transistor; and
implanting said source side of said LDNMOS transistor gate with fluorine to raise the threshold voltage.

* * * * *